United States Patent
Ota et al.

(10) Patent No.: US 10,128,800 B2
(45) Date of Patent: Nov. 13, 2018

(54) DISTORTION COMPENSATION APPARATUS AND DISTORTION COMPENSATION METHOD

(71) Applicant: FUJITSU LIMITED, Kawasaki-shi, Kanagawa (JP)

(72) Inventors: Tomoya Ota, Kawasaki (JP); Toshio Kawasaki, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/802,151

(22) Filed: Nov. 2, 2017

(65) Prior Publication Data

US 2018/0175808 A1   Jun. 21, 2018

(30) Foreign Application Priority Data

Dec. 19, 2016   (JP) .................................. 2016-245951

(51) Int. Cl.
   H03F 1/32    (2006.01)
   H03F 3/24    (2006.01)
   H04B 1/04    (2006.01)

(52) U.S. Cl.
   CPC ......... *H03F 1/3247* (2013.01); *H03F 1/3223* (2013.01); *H03F 3/24* (2013.01); *H04B 1/0475* (2013.01); *H03F 2201/3224* (2013.01); *H04B 2001/0425* (2013.01)

(58) Field of Classification Search
   CPC .................................................. H03F 1/3247
   See application file for complete search history.

(56) References Cited

U.S. PATENT DOCUMENTS

| | | | | |
|---|---|---|---|---|
| 9,237,054 | B2 * | 1/2016 | Kawasaki | ............ H04L 27/367 |
| 9,735,815 | B1 * | 8/2017 | Hirai | .................... H04B 1/0475 |
| 2006/0001487 | A1 * | 1/2006 | Petrovic | ................... H03F 1/26 |
| | | | | 330/149 |
| 2012/0147991 | A1 * | 6/2012 | Matsubara | ............ H03F 1/3241 |
| | | | | 375/296 |
| 2014/0191799 | A1 * | 7/2014 | Ohkawara | ............ H04B 1/0475 |
| | | | | 330/149 |

(Continued)

FOREIGN PATENT DOCUMENTS

| | | |
|---|---|---|
| JP | 2002-084146 A | 3/2002 |
| JP | 2012-227881 A | 11/2012 |

(Continued)

OTHER PUBLICATIONS

Ota, T., et al., A Novel Adaptive Digital Predistortion for Concurrent Multi-Band RF Power Amplifiers, Fig 4. and Fig. 5., IEICE (2016).

(Continued)

*Primary Examiner* — Patricia T Nguyen
(74) *Attorney, Agent, or Firm* — Arent Fox LLP

(57) ABSTRACT

A distortion compensation apparatus include: a feedback unit that generates a feedback signal containing a first frequency component in which a plurality of odd-order distortions are superimposed and a second frequency component in which a plurality of even-order distortions are superimposed according to output of a power amplifier which amplifies a transmission signal; and a signal processor that separates the first frequency component and the second frequency component from the generated feedback signal and performs signal processing.

10 Claims, 11 Drawing Sheets

(56) References Cited

U.S. PATENT DOCUMENTS

2015/0304154 A1* 10/2015 Utsunomiya ......... H04L 27/368
                                                              375/297
2017/0338841 A1* 11/2017 Pratt ................... H04B 1/0475

FOREIGN PATENT DOCUMENTS

JP          2014-003527 A      1/2014
WO     WO 2013/118367 A1    11/2012

OTHER PUBLICATIONS

Bassam, S.A., et al., 2-D Digital Predistortion (2-D-DPD) Architecture for Concurrent Dual-Band Transmitters, IEEE Transactions on Microwave Theory and Techniques, vol. 59, No. 10, pp. 2547-2553, Oct. 2011.

Younes, M., et al., On the Modeling and Linearization of a Concurrent Dual-Band Transmitter Exhibiting Nonlinear Distortion and Hardware Impairments, IEEE Transactions on Circuits and Systems I, vol. 60, No. 11, pp. 3055-3068, Nov. 2013.

Ma, Y., et al., Spectra-Folding Feedback Architecture for Concurrent Dual-Band Power Amplifier Predistortion, IEEE Transactions on Microwave Theory and Techniques, vol. 63, No. 10, pp. 3164-3174, Oct. 2015.

Liu Y., et al., Concurrent Dual-Band Digital Predistortion With a Single Feedback Loop, IEEE Transactions on Microwave Theory and Techniques, vol. 63, No. 5, pp. 1556-1568, May 2015.

* cited by examiner

DISTORTION COMPENSATION APPARATUS AND DISTORTION COMPENSATION METHOD

CROSS-REFERENCE TO RELATED APPLICATION

This application is based upon and claims the benefit of priority of the prior Japanese Patent Application No. 2016-245951, filed on Dec. 19, 2016, the entire contents of which are incorporated herein by reference.

FIELD

The embodiment discussed herein is related to a distortion compensation apparatus and a distortion compensation method.

BACKGROUND

Conventionally, techniques of compensating for nonlinear distortion of a power amplifier used in a base station or the like have been proposed in the field of radio mobile communication. Among such technique, there is a technique of compensating for a nonlinear distortion using a plurality of distortion compensation units and dual band digital predistortion (DPD) when signals at multiple frequency bands are concurrently amplified with a common power amplifier. Further, there is a power amplifier using a dual band DPD that is provided with a Volterra filter of a dual-input truncated Volterra model in front of a two-dimensional look up table (LUT) and also compensates for a second-order distortion. In addition, there are a technique of performing distortion compensation by adding harmonics and intermodulation distortions generated in other bands to signals having inverse characteristics, and a technique of performing distortion compensation by solving a nonlinear simultaneous equation.

[Patent Literature 1] Japanese Laid-open Patent Publication No. 2002-084146

[Patent Literature 2] Japanese Laid-open Patent Publication No. 2012-227881

[Patent Literature 3] Japanese Laid-open Patent Publication No. 2014-003527

[Non-Patent Literature 1] Bassam, S. A., Helaoui, M., Ghannouchi, F. M., "2-D Digital Predistortion (2-D-DPD) Architecture for Concurrent Dual-Band Transmitters," IEEE Transactions on Microwave Theory and Techniques, vol. 59, no. 10, pp. 2547-2553, October 2011.

[Non-Patent Literature 2] Younes, M., Ghannouchi, F. M., "On the Modeling and Linearization of a Concurrent Dual-Band Transmitter Exhibiting Nonlinear Distortion and Hardware Impairments," IEEE Transactions on Circuits and Systems I, vol. 60, no. 11, pp. 3055-3068, November 2013.

[Non-Patent document 3] Ota, Kawasaki, Kimura, Tamanoi, Toru Maniwa "A Novel Adaptive Digital Predistortion for Concurrent Multi-Band RF Power Amplifiers," IEICE Tech. Rep., vol. 116, no. 12, MW2016-2, pp. 7-10, April 2016.

[Non-Patent Literature 4] Yuelin Ma, Yasushi Yamao, "Spectra-Folding Feedback Architecture for Concurrent Dual-Band Power Amplifier Predistortion," IEEE Transactions on Microwave Theory and Techniques, vol. 63, no. 10, pp. 3164-3174, October 2015.

[Non-Patent Literature 5] Youjiang Liu, Jonmei J. Yan, Peter M. Asbeck, "Concurrent Dual-Band Digital Predistortion With a Single Feedback Loop," IEEE Transactions on Microwave Theory and Techniques, vol. 63, no. 5, pp. 1556-1568, May 2015.

However, it is sometimes difficult to obtain sufficient distortion compensation performance in a distortion compensation apparatus, which may cause deterioration of radio quality. For example, it is assumed a case where signals at multiple frequency bands are concurrently amplified by a common power amplifier. In this case, under a condition that center frequencies of two bands have a relationship of approximately twice (for example, 4.6 GHz and 9 GHz), a distortion of an even order (hereinafter, simply referred to as an "even-order distortion") may occur at a frequency corresponding to a difference between these center frequencies or at a frequency corresponding to twice the center frequency which is lower than the other. In addition, there is a case where the even-order distortion occurs similarly in a case where isolation of a combiner is insufficient even when signals at multiple frequency bands are concurrently amplified by a plurality of power amplifiers and combined. If a distortion compensation apparatus is configured so as to compensate for such an even-order distortion, a circuit scale of the distortion compensation apparatus increases in some cases.

SUMMARY

According to an aspect of an embodiment, a distortion compensation apparatus includes a feedback unit that generates a feedback signal containing a first frequency component in which a plurality of odd-order distortions are superimposed and a second frequency component in which a plurality of even-order distortions are superimposed according to output of a power amplifier which amplifies a transmission signal; and a signal processor that separates each of the first frequency component and the second frequency component from the generated feedback signal and performs signal processing.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENT

Preferred embodiment of the present invention will be explained with reference to accompanying drawings. Incidentally, the disclosed technique is not limited to the embodiment. In addition, configurations having the same functions will be denoted by the same reference sign in the embodiment, and the repeated description thereof will be omitted.

A distortion compensation apparatus according to an embodiment will be described. In a base station, the nonlinearity of a power amplifier may fluctuate over time when a transmission signal is amplified by the power amplifier. The distortion compensation apparatus may adaptively compensate for the nonlinearity of the power amplifier when the transmission signal is amplified by the power amplifier.

Figure 1:
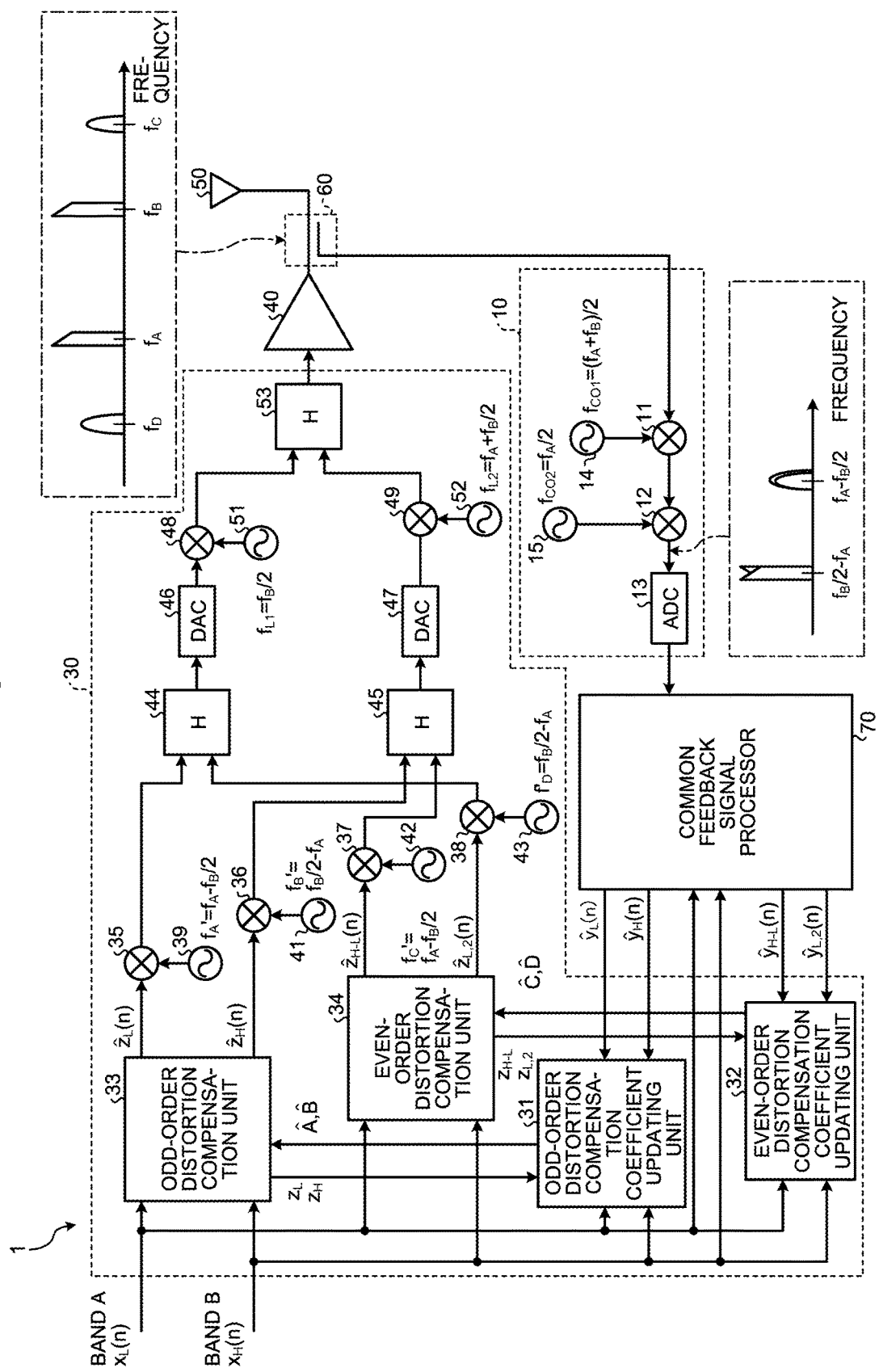
FIG. 1 is a diagram illustrating a configuration of a distortion compensation apparatus according to an embodiment.

For example, a distortion compensation apparatus 1 includes a power amplifier 40 and an antenna 50 as illustrated in FIG. 1. The distortion compensation apparatus 1 illustrated in FIG. 1 adopts a digital pre-distortion (DPD) technique of adaptively performing distortion compensation of non-stationary data according to output of the power amplifier 40. That is, the distortion compensation apparatus 1 adaptively performs distortion compensation with respect to the nonlinearity of the power amplifier 40 that may fluctuate over time.

Among distortions according to the nonlinearity of the power amplifier 40, a distortion corresponding to an odd-order term when the nonlinearity of the power amplifier 40 is mathematically developed by power series is called an odd-order distortion, and a distortion corresponding to an even-order term thereof is called an even-order distortion. When viewed in a frequency spectrum, the odd-order distortion appears in a frequency band of an RF-band component and a frequency band of three times the RF-band component, and the even-order distortion appears in a frequency band near a baseband and in a frequency band of twice the RF-band component.

Figure 2:
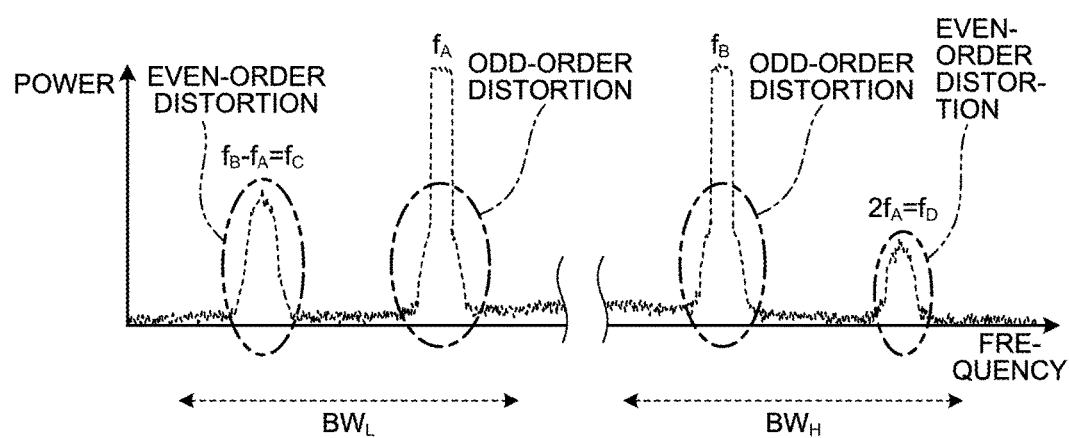
FIG. 2 is a view illustrating a frequency spectrum including an odd-order distortion and an even-order distortion according to the embodiment.

When a transmission signal is a multi-band signal, signals at multiple frequency bands are concurrently amplified by the common power amplifier 40 in some cases. At this time, a nonlinear distortion of a signal of a certain frequency band has influence on signals of other frequency bands. For example, a distortion appears in a region surrounded by the one-dot chain line in the frequency spectrum indicated by the broken line in FIG. 2. When dual-band signals of a band A and a band B are amplified in common by the power amplifier 40, a distortion appears as illustrated in FIG. 2 when assuming that a center frequency of the band A is $f_A$ and a center frequency of the band B is $f_B$. The odd-order distortion appears in a region near each of the frequencies $f_A$ and $f_B$ of the bands A and B, and the even-order distortion appears in a region near a difference frequency $f_B-f_A$ ($=f_C$) between the bands A and B and in a region near a frequency $2f_A$ ($=f_D$) twice the band A. That is, in a low band $BW_L$, the even-order distortion appears in the region near the frequency $f_B-f_A=f_C$, and the odd-order distortion appears in the region near the frequency $f_A$. In a high band $BW_H$, the odd-order distortion appears in the region near frequency $f_B$, and the even-order distortion appears in the region near the frequency $2f_A=f_D$.

As illustrated in FIG. 2, the odd-order distortion may overlap, in terms of the frequency, with each RF-band component (frequencies $f_A$ and $f_B$) of the transmission signal, whereas the even-order distortion occurs out of the band of the respective RF-bands in some cases. Thus, the even-order distortion may be regarded to be removable by a filtering process of selectively attenuating out-of-band components of the respective RF-bands.

However, when the multi-band signal is amplified by the power amplifier 40, the even-order distortion may approach the RF-band component in terms of the frequency under a condition that the center frequencies of the two bands have the relationship of approximately twice ($2 \times f_A \approx f_B$, for example, $f_A$=4.6 GHz, $f_B$=9 GHz). The even-order distortion appearing in the vicinity of the difference frequency $f_B-f_A$ between the bands A and B may approach the RF-band component (band A) of the frequency $f_A$ in terms of the frequency. The even-order distortion appearing in the vicinity of the frequency $2f_A$, which is twice the frequency of the band A, may approach the RF-band component (band B) of the frequency $f_B$ in terms of the frequency. When such even-order distortion occurs at a frequency close to the RF-band component of the transmission signal, it may be difficult to cut the even-order distortion by the filter. In addition, even if the even-order distortion is cut, there is a possibility that a circuit scale of the distortion compensation apparatus 1 increases since a steep filter is used.

On the other hand, the distortion compensation apparatus 1 illustrated in FIG. 1 is configured to be capable of compensating for each of the odd-order distortion and the even-order distortion. The distortion compensation apparatus 1 has a compensation circuit 30. The compensation circuit 30 includes an odd-order distortion compensation coefficient updating unit 31, an even-order distortion compensation coefficient updating unit 32, an odd-order distortion compensation unit 33, an even-order distortion compensation unit 34, and up-converters 35, 36, 37, 38, 48 and 49. The compensation circuit 30 has oscillators 39, 41, 42, 43, 51 and 52, signal combiners 44, 45 and 53, and digital to analog converters (DACs) 46 and 47.

The odd-order distortion compensation coefficient updating unit 31 updates odd-order distortion compensation coefficients and supplies the updated odd-order distortion compensation coefficients (^A or ^B) to the odd-order distortion compensation unit 33. The odd-order distortion compensation unit 33 receives a transmission signal $x_L(n)$ of the band A and a transmission signal $x_H(n)$ of the band B. The odd-order distortion compensation unit 33 uses the transmission signal $x_L(n)$ of the band A, the transmission signal $x_H(n)$ of the band B, and the odd-order distortion compensation coefficient (^A) to generate an odd-order distortion compensation signal ^$z_L(n)$ of the band A (the center frequency $f_A$). The odd-order distortion compensation unit 33 uses the transmission signal $x_L(n)$ of the band A, the transmission signal $x_H(n)$ of the band B, and the odd-order distortion compensation coefficient (^B) to generate an odd-order distortion compensation signal ^$z_H$(n) of the band B (the center frequency $f_B$).

Similarly, the even-order distortion compensation coefficient updating unit 32 updates even-order distortion compensation coefficients and supplies the updated even-order distortion compensation coefficients (^C or ^D) to the even-order distortion compensation unit 34. The even-order distortion compensation unit 34 receives the transmission signal $x_L$(n) of the band A and receives the transmission signal $x_H$(n) of the band B. The even-order distortion compensation unit 34 uses the transmission signal $x_L$(n) of the band A, the transmission signal $x_H$(n) of the band B, and the even-order distortion compensation coefficient (^C) to generate an odd-order distortion compensation signal ^$z_{H-L}$(n) of the center frequency $f_C=f_B-f_A$. The even-order distortion compensation unit 34 uses the transmission signal $x_H$(n) of the band A, the transmission signal $x_H$(n) of the band B, and the even-order distortion compensation coefficient (^D) to generate an even-order distortion compensation signal ^$z_{L,2}$(n) of the center frequency $f_D=2f_A$.

In a digital domain, the up-converter 35 multiplies a local signal of a frequency $f'_A=f_A-f_B/2$ from the oscillator 39 by the odd-order distortion compensation signal ^$z_L$(n) of the band A (the center frequency $f_A$) to perform frequency conversion. The up-converter 38 multiplies a local signal of a frequency $f'_D=f_B/2-f_A$ from the oscillator 39 by the even-order distortion compensation signal ^$z_{H-L}$(n) of the center frequency $f_C=f_B-f_A$ to perform frequency conversion. The odd-order distortion compensation signal ^$z_L$(n) and the even-order distortion compensation signal ^$z_{H-L}$(n) after the frequency conversion are combined by the digital signal combiner 44, and then, subjected to DA conversion by the DAC 46. The up-converter 48 multiplies a local signal of a frequency $f_{L1}=f_B/2$ from the oscillator 51 by an analog signal obtained by the DA conversion in the DAC 46 and frequency-converts the resultant to a radio frequency (the frequency $f_A$) to obtain an RF signal.

Similarly, the up-converter 36 multiplies a local signal of a frequency $f'_B=f_B/2-f_A$ from the oscillator 41 by the odd-order distortion compensation signal ^$z_H$(n) of the band B (the center frequency $f_B$) to perform frequency conversion. The up-converter 37 multiplies a local signal of a frequency $f'_C=f_A-f_B/2$ from the oscillator 42 by the even-order distortion compensation signal ^$z_{L,2}$(n) of the center frequency $f_D=2f_A$ to perform frequency conversion. The odd-order distortion compensation signal ^$z_H$(n) and the even-order distortion compensation signal ^$z_{L,2}$(n) after the frequency conversion are combined by the digital signal combiner 45, and then, subjected to DA conversion by the DAC 47. The up-converter 49 multiplies a local signal of a frequency $f_{L2}=f_A+f_B/2$ from the oscillator 52 by an analog signal obtained by the DA conversion in the DAC 47 and frequency-converts the resultant to a radio frequency (the frequency $f_B$) to obtain an RF signal.

The RF signal from the up-converter 48 and the RF signal from the up-converter 49 are combined by the signal combiner 53, and then, input to the power amplifier 40. The RF signal input to the power amplifier 40 contains a component corresponding to an inverse characteristic of the odd-order distortion and a component corresponding to an inverse characteristic of the even-order distortion, and thus, it is possible to suppress the odd-order distortion and the even-order distortion when the RF signal (transmission signal) is power-amplified by the power amplifier 40. That is, the distortion compensation apparatus 1 may compensate for the odd-order distortion and the even-order distortion according to the nonlinearity of the power amplifier 40.

The distortion compensation apparatus 1 further includes a coupler 60. The coupler 60 is provided on an output side of the power amplifier 40 and is capable of extracting a part of the output of the power amplifier 40 (a signal corresponding to the output of the power amplifier 40).

It is conceivable to add a signal distributor, four down-converters, and four analog to digital converters (ADCs) in the distortion compensation apparatus 1 in order to adaptively compensate for the nonlinearity of the power amplifier 40 that may fluctuate over time. That is, the signal extracted by the coupler 60 according to the output of the power amplifier 40 is distributed into four signals by the signal distributor, and each of the four signals is frequency-converted by the four down-converters from the frequencies $f_A$, $f_B$, $f_C=f_B-f_A$, $f_D=2f_A$ into the baseband. The four ADCs perform AD-conversion of each of analog signals input from the corresponding down-converters among the four down-converters and supplies the converted signal to the compensation circuit 30. In this case, since the down-converters and the ADCs corresponding to the number of distortions that needs to be compensated are provided, the number of analog parts is likely to increase, and the circuit scale of the distortion compensation apparatus 1 is likely to increase.

Thus, the reduction of the circuit scale of the distortion compensation apparatus 1 is achieved in the embodiment by configuring a feedback system in the distortion compensation apparatus 1 such that a feedback signal in which the odd-order distortions are superimposed and the even-order distortions are superimposed is generated and the frequency conversion and the AD conversion are performed in common.

Specifically, the distortion compensation apparatus 1 further includes a common feedback unit 10 and a common feedback signal processor 70 as illustrated in FIG. 1. The common feedback unit 10 is arranged between the coupler 60 and the common feedback signal processor 70. The common feedback unit 10 generates a common feedback signal according to the output of the power amplifier that amplifies the transmission signal. The common feedback signal contains an odd-order distortion component (first frequency component) in which a plurality of odd-order distortions are superimposed on the frequency spectrum and an even-order distortion component (second frequency component) in which a plurality of even-order distortions are superimposed on the frequency spectrum. The common feedback unit 10 causes the odd-order distortion generated in the vicinity of the band A (the center frequency: $f_A$) on the odd-order distortion generated in the vicinity of the band B (the center frequency: $f_B$) to be superimposed on each other at the time of down-converting the signal extracted by the coupler 60 according to the output of the power amplifier 40. In addition, the common feedback unit 10 causes the even-order distortion generated in the vicinity of the center frequency $f_D=2f_A$ and the even-order distortion generated in the vicinity of the center frequency $f_C=f_B-f_A$ to be superimposed on each other. In this manner, the common feedback unit 10 generates the common feedback signal. The common feedback unit 10 supplies the generated common feedback signal to the common feedback signal processor 70.

The common feedback unit 10 includes a common down-converter (first frequency conversion unit) 11, a common down-converter (second frequency conversion unit) 12, an AD conversion unit (ADC) 13, and oscillators 14 and 15.

The common down-converter 11 multiplies the signal obtained by extracting a part of the output of the power amplifier 40 using the coupler 60 by a local signal of a local frequency $f_{CO1}=(f_A+f_B)/2$ from the oscillator 14. Accordingly, the common down-converter 11 down-converts the signal extracted by the coupler 60 from the RF (radio frequency) to an IF (intermediate frequency). At this time, the odd-order distortion in the vicinity of the center frequency $f_A$ of the band A is down-converted to $$f_{CO1} - f_A = (f_B - f_A)/2 \quad (1).$$

The odd-order distortion in the vicinity of the center frequency $f_A$ of the band B is down-converted to $$f_B - f_{CO1} = (f_B - f_A)/2 \quad (2).$$

By Formulas 1 and 2, the odd-order distortions are down-converted to approximately the same intermediate frequency $(f_B - f_A)/2$.

In addition, the even-order distortion in the vicinity of the center frequency $f_C = f_B - f_A$ is down-converted to $$f_{CO1} - f_C = (3f_A - f_B)/2 \quad (3).$$

The even-order distortion in the vicinity of the center frequency $f_D = 2f_A$ is down-converted to $$f_D - f_{CO1} = (3f_A - f_A)/2 \quad (4).$$

By Formulas (3) and (4), the even-order distortions are down-converted to approximately the same intermediate frequency $(3f_A - f_B)/2$.

That is, the common down-converter 11 down-converts the signal extracted by the coupler 60 from the RF to the IF, folds back the signal at the IF, and generate the common feedback signal. The common feedback signal contains the odd-order distortion component (the first frequency component) in which the plurality of odd-order distortions are superimposed on the frequency spectrum and the even-order distortion component (the second frequency component) in which the plurality of even-order distortions are superimposed on the frequency spectrum.

The common down-converter 12 multiplies the common feedback signal generated by the common down-converter 11 by a local signal having a local frequency $f_{CO2}=f_A/2$ from the oscillator 15 and down-converts the resultant from the intermediate frequency (IF) to the baseband frequency. At this time, the odd-order distortion component in which the odd-order distortions are superimposed on each other down-converted to $$(f_B - f_A)/2 - f_{CO2} = f_B/2 - f_A \quad (5).$$

The even-order distortion component in which the even-order distortions are superimposed on each other is down-converted to $$(3f_A - f_B)/2 - f_{CO2} = f_A - f_B/2 \quad (6).$$

According to Formulas 5 and 6, a frequency at the midpoint between the odd-order distortion component and the even-order distortion component becomes approximately 0 Hz in the down-converted common feedback signal as expressed in the following Formula 7.

$$\{(f_B/2 - f_A) + (f_A - f_B/2)\}/2 = 0 \quad (7)$$

That is, the common down-converter 12 shifts the center frequency of the common feedback signal such that the frequency at the midpoint between the odd-order distortion component and the even-order distortion component becomes approximately 0 Hz.

The ADC 13 converts the common feedback signal, which has been down-converted to the baseband frequency by the common down-converter 12, from an analog format to a digital format and supplies the converted common feedback signal to the common feedback signal processor 70.

The common feedback signal processor 70 separates each of the odd-order distortion component (the first frequency component) and the even-order distortion component (the second frequency component) from the common feedback signal and performs signal processing.

Figure 3:
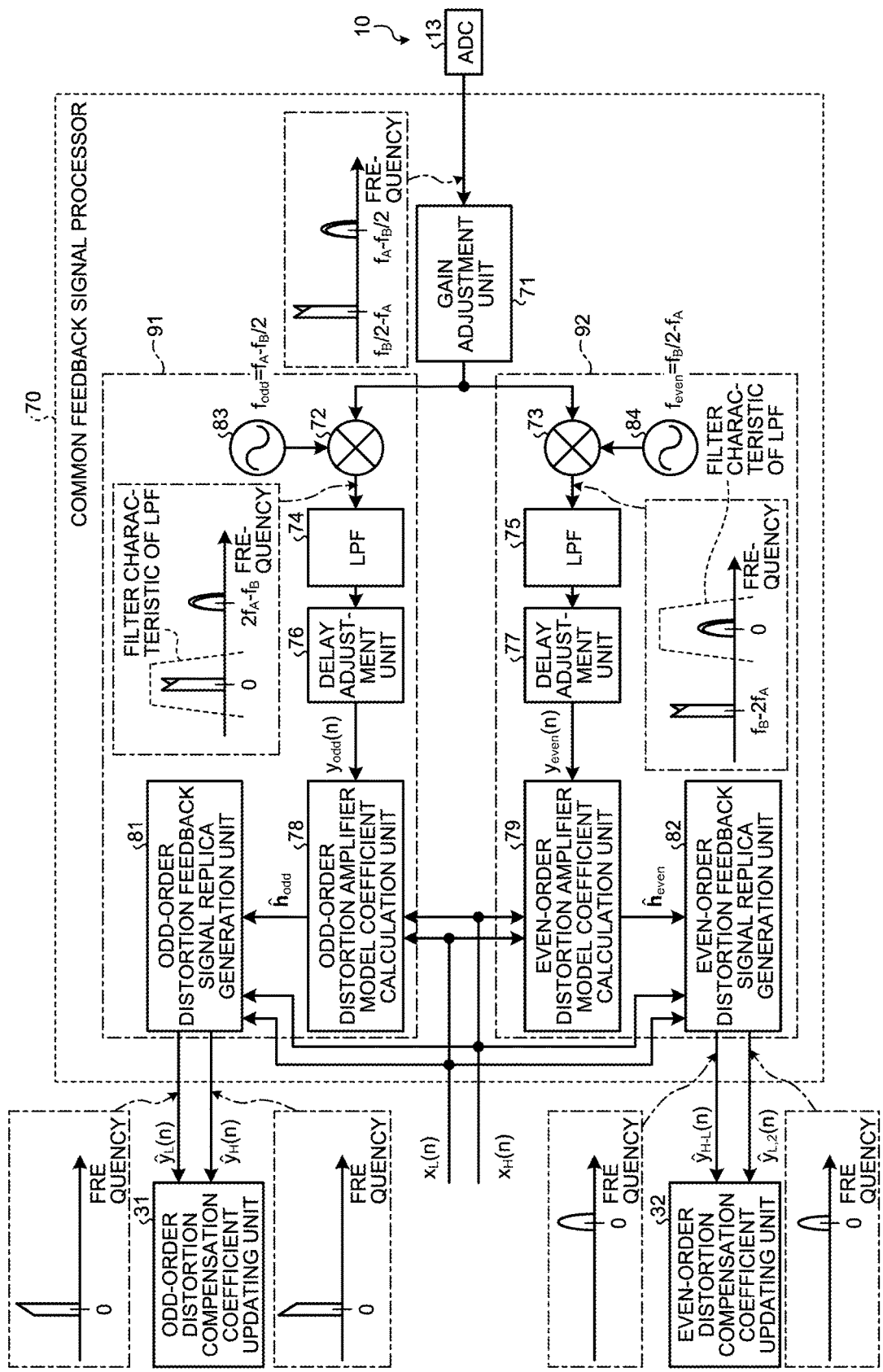
FIG. 3 is a diagram illustrating a configuration of a common feedback signal processor according to the embodiment.

For example, the common feedback signal processor 70 includes a gain adjustment unit 71, a generation unit (first generation unit) 91, and a generation unit (second generation unit) 92 as illustrated in FIG. 3. The generation unit 91 includes a mixer (third frequency conversion unit) 72, an LPF (first low-pass filter) 74, a delay adjustment unit 76, an odd-order distortion amplifier model coefficient calculation unit 78, an odd-order distortion feedback signal replica generation unit 81, and an oscillator 83. The generation unit 92 includes a mixer (fourth frequency conversion unit) 73, an LPF (second low-pass filter) 75, a delay adjustment unit 77, an even-order distortion amplifier model coefficient calculation unit 79, an even-order distortion feedback signal replica generation unit 82, and an oscillator 84.

The gain adjustment unit 71 receives the common feedback signal from the ADC 13 of the common feedback unit 10. The gain adjustment unit 71 adjusts a gain according to the common feedback signal. For example, the gain adjustment unit 71 compares an average value of power of the common feedback signal with a predetermined target value to obtain the gain. The gain adjustment unit 71 transfers the common feedback signal, which has been level-adjusted according to the obtained gain, to each of the mixer 72 and the mixer 73.

The mixer 72 receives the common feedback signal from the gain adjustment unit 71. The mixer 72 multiplies the common feedback signal by a local signal of a local frequency $f_{odd}=f_A-f_B/2$ from the oscillator 83 to shift the center frequency of the common feedback signal by $f_A-f_B/2$. At this time, the frequency of the odd-order distortion component in the common feedback signal is converted to $$(f_B/2 - f_A) + (f_A - f_B/2) = 0 \quad (8)$$

according to Formula 5. According to Formula 6, the frequency of the even-order distortion component is converted to the vicinity of $$(f_A - f_B/2) + (f_A - f_B/2) = 2f_A - f_B \quad (9).$$

The LPF 74 receives the common feedback signal whose center frequency has been shifted by the mixer 72. The LPF 74 selectively passes the odd-order distortion component in the common feedback signal and removes the even-order distortion component. That is, the LPF 74 extracts the odd-order distortion component from the common feedback signal and supplies a signal containing the odd-order distortion component to the delay adjustment unit 76.

The delay adjustment unit 76 delays the signal containing the odd-order distortion component with a predetermined delay amount and supplies the delayed signal to the odd-order distortion amplifier model coefficient calculation unit 78 as an odd-order distortion common feedback signal $y_{odd}(n)$.

Similarly, the mixer 73 receives the common feedback signal from the gain adjustment unit 71. The mixer 73 multiplies the common feedback signal by a local signal of a local frequency $f_{even}=f_B/2-f_A$ from the oscillator 84 to shift the center frequency of the common feedback signal by $f_B/2-f_A$. At this time, the frequency of the odd-order distortion component in the common feedback signal is converted to $$(f_B/2-f_A)+(f_B/2-f_A)=f_B=2f_A \qquad (10)$$

according to Formula 5. According to Formula 6, the frequency of the even-order distortion component is converted to the vicinity of $$(f_A-f_B/2)+(f_B/2-f_A)=0 \qquad (11).$$

The LPF 75 receives the common feedback signal whose center frequency has been shifted by the mixer 73. The LPF 75 selectively passes the even-order distortion component in the common feedback signal and removes the odd-order distortion component. That is, the LPF 75 extracts the even-order distortion component from the common feedback signal and supplies a signal containing the even-order distortion component to the delay adjustment unit 77.

The delay adjustment unit 77 delays the signal containing the even-order distortion component with a predetermined delay amount and supplies the delayed signal to the even-order distortion amplifier model coefficient calculation unit 79 as an even-order distortion common feedback signal $y_{even}(n)$.

Here, when assuming that the common feedback signal processor 70 has a memory-less configuration for the sake of simplicity, the odd-order distortion common feedback signal $y_{odd}(n)$ supplied to the odd-order distortion amplifier model coefficient calculation unit 78 is expressed by the following Formula 12.

$$y_{odd}(n) = \{y_L(n)\}^* + y_H(n) = \sum_{p=0}^{P}\sum_{q=0}^{Q} a_{p,q}|x_L(n)|^{2p}|x_H(n)|^{2q}\{x_L(n)\}^* + \sum_{p=0}^{P}\sum_{q=0}^{Q} b_{p,q}|x_L(n)|^{2p}|x_H(n)|^{2q}x_H(n) \qquad (12)$$

In Formula 12, $x_L(n)$ is a transmission signal on the low band $BW_L$ (see FIG. 2) side, and $x_H(n)$ is a transmission signal on the high band $BW_H$ (see FIG. 2) side. In addition, $y_L(n)$ represents a signal of the band A (the center frequency: $f_A$) output from the power amplifier 40, and $y_H(n)$ represents a signal of the band B (the center frequency: $f_B$) output from the power amplifier 40. Further, $a_{p,q}$ and $b_{p,q}$ are amplifier model coefficients derived from an amplifier model corresponding to the characteristics of the power amplifier 40. The amplifier model is set, in advance, in the odd-order distortion amplifier model coefficient calculation unit 78. At this time, $y_{odd}(n)$ is expressed by the following Formula 13 if expressed in a matrix form.

$$y_{odd}=U_{odd}h_{odd} \qquad (13)$$

In Formula 13, $y_{odd}$ is a vector including the odd-order distortion common feedback signal at each sampling timing n to n+N−1, and is expressed by the following Formula 14.

$$y_{odd}=[y_{odd}(n)y_{odd}(n+1)\ldots y_{odd}(n+N-1)]^T \qquad (14)$$

In Formula 13, $U_{odd}$ is a matrix including odd-order terms of transmission signals of the respective bands at the sampling timing n to n+N−1, and is expressed by the following Formula 15.

$$\left.\begin{array}{l}U_{odd} = [U_L^* \ U_H] \\ U_L = [u_L(n) \ u_L(n+1) \ \ldots \ u_L(n+N-1)]^T \\ u_L(k) = [x_L(k) \ |x_L(k)|^2 x_L(k) \ |x_H(k)|^2 x_L(k) \ \ldots \ |x_L(k)|^{2P}|x_H(k)|^{2Q} x_L(k)] \\ U_H = [u_H(n) \ u_H(n+1) \ \ldots \ u_H(n+N-1)]^T \\ u_H(k) = [x_H(k) \ |x_L(k)|^2 x_H(k) \ |x_H(k)|^2 x_H(k) \ \ldots \ |x_L(k)|^{2P}|x_H(k)|^{2Q} x_H(k)]\end{array}\right\} \qquad (15)$$

In Formula 13, $h_{odd}$ is a vector of a transfer function of the power amplifier 40, and is expressed by the following Formula 16.

$$\left.\begin{array}{l}h_{odd} = [a^T \ b^T]^T \\ a = [a_{0,0} \ \ldots \ a_{P,Q}]^T \\ b = [b_{0,0} \ \ldots \ b_{P,Q}]^T\end{array}\right\} \qquad (16)$$

When the matrix equation of Formula 13 is solved with respect to $h_{odd}$, Formula 17 is obtained. In Formula 17, $h_{odd}$ is expressed particularly as a vector $\hat{h}_{odd}$.

$$\hat{h}_{odd}=(U_{odd}^H U_{odd})^{-1}U_{odd}^H y_{odd} \qquad (17)$$

In Formula 17, a superscript H represents a Hermitian transpose (to transpose the matrix and take a complex conjugate of components thereof), and a superscript −1 represents an inverse matrix.

That is, the odd-order distortion amplifier model coefficient calculation unit 78 illustrated in FIG. 3 uses the vector $y_{odd}$ including the odd-order distortion common feedback signal and the matrix $U_{odd}$ including the odd-order terms of the transmission signals of the respective bands to obtain the coefficient vector $\hat{h}_{odd}$ as expressed in Formula 17. As expressed in Formula 16, the coefficient vector $\hat{h}_{odd}$ contains an amplifier model coefficient $\hat{a}_{p,q}$ ($0\le p\le P$, $0\le q\le Q$) and an amplifier model coefficient $\hat{b}_{p,q}$ ($0\le p\le P$, $0\le q\le Q$). The odd-order distortion amplifier model coefficient calculation unit 78 supplies the obtained coefficient vector $\hat{h}_{odd}$ to the odd-order distortion feedback signal replica generation unit 81.

The odd-order distortion feedback signal replica generation unit 81 uses the amplifier model coefficients $\hat{a}_{p,q}$ ($0\le p\le P$, $0\le q\le Q$) to generate an odd-order distortion feedback signal replica $\hat{y}_L(n)$ of the band A (the center frequency: $f_A$) as expressed in the following Formula 18. The amplifier model coefficient $\hat{a}_{p,q}$ is included in the coefficient vector $\hat{h}_{odd}$.

$$\hat{y}_L(n) = \sum_{p=0}^{P}\sum_{q=0}^{Q} \hat{a}_{p,q}|x_L(n)|^{2p}|x_H(n)|^{2q}x_L(n) \qquad (18)$$

The odd-order distortion feedback signal replica generation unit 81 uses the amplifier model coefficients $\hat{b}_{p,q}$ ($0\le p\le P$, $0\le q\le Q$) to generate an odd-order distortion feedback signal replica $\hat{y}_H(n)$ of the band B (the center frequency: $f_B$) as expressed in the following Formula 19. The amplifier model coefficient is $\hat{b}_{p,q}$ is included in the coefficient vector $\hat{h}_{odd}$.

$$\hat{y}_H(n) = \sum_{p=0}^{P}\sum_{q=0}^{Q} \hat{b}_{p,q}|x_L(n)|^{2p}|x_H(n)|^{2q}x_H(n) \qquad (19)$$

The odd-order distortion feedback signal replica generation unit 81 supplies the odd-order distortion feedback signal replica $\hat{y}_L(n)$ and the odd-order distortion feedback signal replica $\hat{y}_H(n)$ to the odd-order distortion compensation coefficient updating unit 31.

Similarly, the even-order distortion common feedback signal $y_{even}(n)$ supplied to the even-order distortion amplifier model coefficient calculation unit 79 is expressed by the following Formula 20.

$$y_{even}(n) = \{y_{H-L}(n)\}^* + y_{L,2}(n) = \qquad(20)$$
$$\sum_{p=0}^{P}\sum_{q=0}^{Q} c_{p,q}|x_L(n)|^{2p}|x_H(n)|^{2q}(\{x_L(n)\}^* x_H(n))^* +$$
$$\sum_{p=0}^{P}\sum_{q=0}^{Q} d_{p,q}|x_L(n)|^{2p}|x_H(n)|^{2q}\{x_L(n)\}^2$$

In Formula 20, $x_L(n)$ is the transmission signal on the low band $BW_L$ (see FIG. 2) side, and $x_H(n)$ is the transmission signal on the high band $BW_H$ (see FIG. 2) side. In addition, $y_{H-L}(n)$ represents an even-order distortion component generated at the center frequency $f_C=f_B-f_A$, and $y_{L,2}(n)$ represents an even-order distortion component generated at the center frequency $f_D=2f_A$. Further, $c_{p,q}$ and $d_{p,q}$ are amplifier model coefficients derived from an amplifier model corresponding to the characteristics of the power amplifier 40. The amplifier model is set, in advance, in the even-order distortion amplifier model coefficient calculation unit 79. At this time, $y_{even}(n)$ is expressed by the following Formula 21 if expressed in a matrix form.

$$y_{even}=U_{even}h_{even} \qquad(21)$$

In Formula 21, $y_{even}$ is a vector including the even-order distortion common feedback signal at each sampling timing n to n+N−1, and is expressed by the following Formula 22.

$$y_{even}=[y_{even}(n)\,y_{even}(n+1)\,\ldots\,y_{even}(n+N-1)]^T \qquad(22)$$

In Formula 21, $U_{even}$ is a matrix including even-order terms of transmission signals of the respective bands at the sampling timing n to n+N−1, and is expressed by the following Formula 23.

$$\left.\begin{array}{l} U_{even} = [U_{H-L}^* \; U_{L,2}] \\ U_{H-L} = [u_{H-L}(n)\, u_{H-L}(n+1)\, \ldots\, u_{H-L}(n+N-1)]^T \\ u_{H-L}(k) = \begin{bmatrix} \{x_L(k)\}^* x_H(k) & |x_L(k)|^2\{x_L(k)\}^* x_H(k) \\ |x_H(k)|^2\{x_L(k)\}^* x_H(k) & \ldots & |x_L(k)|^{2P}|x_H(k)|^{2Q}\{x_L(k)\}^* x_H(k) \end{bmatrix} \\ U_{L,2} = [u_{L,2}(n)\, u_{L,2}(n+1)\, \ldots\, u_{L,2}(n+N-1)]^T \\ u_{L,2}(k) = \begin{bmatrix} \{x_L(k)\}^2 & |x_L(k)|^2\{x_L(k)\}^2 & |x_H(k)|^2\{x_L(k)\}^2 & \ldots \\ & |x_L(k)|^{2P}|x_H(k)|^{2Q}\{x_L(k)\}^2 & \end{bmatrix} \end{array}\right\} \qquad(23)$$

In Formula 21, $h_{even}$ is a vector of a transfer function of the power amplifier 40, and is expressed by the following Formula 24.

$$\left.\begin{array}{l} h_{even} = [c^T \; d^T]^T \\ c = [c_{0,0} \; \ldots \; c_{P,Q}]^T \\ d = [d_{0,0} \; \ldots \; d_{P,Q}]^T \end{array}\right\} \qquad(24)$$

When the matrix equation of Formula 21 is solved with respect to $h_{even}$, Formula 25 is obtained. In Formula 25, $h_{even}$ is expressed particularly as a vector $\hat{h}_{even}$.

$$\hat{h}_{even}=(U_{even}^H U_{even})^{-1} U_{even}^H y_{even} \qquad(25)$$

In Formula 25, a superscript "H" represents a Hermitian transpose (to transpose the matrix and take a complex conjugate of components thereof), and a superscript "−1" represents an inverse matrix.

That is, the even-order distortion amplifier model coefficient calculation unit 79 illustrated in FIG. 3 uses the vector $y_{even}$ including the even-order distortion common feedback signal and the matrix $U_{even}$ including the even-order terms of the transmission signals of the respective bands to obtain the coefficient vector $\hat{h}_{even}$ as expressed in Formula 25. As expressed in Formula 24, the coefficient vector $\hat{h}_{even}$ contains an amplifier model coefficient $\hat{c}_{p,q}$ (0≤p≤P, 0≤q≤Q) and an amplifier model coefficient $\hat{d}_{p,q}$ (0≤p≤P, 0≤q≤Q). The even-order distortion amplifier model coefficient calculation unit 79 supplies the obtained coefficient vector $\hat{h}_{even}$ to the even-order distortion feedback signal replica generation unit 82.

The even-order distortion feedback signal replica generation unit 82 uses the amplifier model coefficients $\hat{c}_{p,q}$ (0≤p≤P, 0≤q≤Q) to generate an even-order distortion feedback signal replica $\hat{y}_{H-L}(n)$ of the center frequency $f_C=f_B-f_A$ as expressed in the following Formula 26. The amplifier model coefficient $\hat{c}_{p,q}$ is included in the coefficient vector $\hat{h}_{even}$.

$$\hat{y}_{H-L}(n) = \sum_{p=0}^{P}\sum_{q=0}^{Q} \hat{c}_{p,q}|x_L(n)|^{2p}|x_H(n)|^{2q}\{x_L(n)\}^* x_H(n) \qquad(26)$$

The even-order distortion feedback signal replica generation unit 82 uses the amplifier model coefficients $\hat{d}_{p,q}$ (0≤p≤P, 0≤q≤Q) to generate an even-order distortion feedback signal replica $\hat{y}_{L-2}(n)$ of the center frequency $f_D=2f_A$ as expressed in the following Formula 27. The amplifier model coefficient $\hat{d}_{p,q}$ is included in the coefficient vector $\hat{h}_{even}$.

$$\hat{y}_{L,2}(n) = \sum_{p=0}^{P}\sum_{q=0}^{Q} \hat{d}_{p,q}|x_L(n)|^{2p}|x_H(n)|^{2q}\{x_L(n)\}^2 \qquad(27)$$

The even-order distortion feedback signal replica generation unit 82 supplies the even-order distortion feedback signal replica $\hat{y}_{H-L}(n)$ and the even-order distortion feedback signal replica $\hat{y}_{L,2}(n)$ to the even-order distortion compensation coefficient updating unit 32.

The odd-order distortion compensation coefficient updating unit 31 receives the odd-order distortion feedback signal replica $\hat{y}_L(n)$ and the odd-order distortion feedback signal replica $\hat{y}_H(n)$ from the odd-order distortion feedback signal replica generation unit 81. The odd-order distortion compensation coefficient updating unit 31 receives the transmission signal $x_L(n)$ of the band A and the transmission signal $x_H(n)$ of the band B. The odd-order distortion compensation coefficient updating unit 31 performs odd-order distortion compensation signal processing using the odd-order distortion feedback signal replica $\hat{y}_L(n)$, the odd-order distortion feedback signal replica $\hat{y}_H(n)$, the transmission signal $x_L(n)$ of the band A, and the transmission signal $x_H(n)$ of the band B. That is, the odd-order distortion compensation coefficient updating unit 31 performs calculation as expressed in the following Formula 28 to update the distortion compensation coefficient vectors ˆA and ˆB.

$$\hat{A} = (W_L^H W_L)^{-1} W_L^H z_L \\ \hat{B} = (W_H^H W_H)^{-1} W_H^H z_H \} \quad (28)$$

The distortion compensation coefficient vectors ˆA and ˆB in Formula 28 represent the updated odd-order distortion compensation coefficients and are expressed as in Formula 29.

$$\hat{A} = [\hat{A}_{0,0} \ \ldots \ \hat{A}_{P,Q}]^T \\ \hat{B} = [\hat{B}_{0,0} \ \ldots \ \hat{B}_{P,Q}]^T \} \quad (29)$$

Matrices $W_L$ and $W_H$ in Formula 28 are obtained from the odd-order distortion feedback signal replica $\hat{y}_L(n)$ and the odd-order distortion feedback signal replica $\hat{y}_H(n)$. The matrices $W_L$ and $W_H$ are matrices including odd-order terms of the odd-order distortion feedback signals of the respective bands and are expressed as in the following Formula 30.

$$W_L = [w_L(n) \ w_L(n+1) \ \ldots \ w_L(n+N-1)]^T \\ w_L(k) = [\hat{y}_L(k) \ |\hat{y}_L(k)|^2 \hat{y}_L(k) \ |\hat{y}_H(k)|^2 \hat{y}_L(k) \ \ldots \ |\hat{y}_L(k)|^{2P}|\hat{y}_H(k)|^{2Q} \hat{y}_L(k)] \\ W_H = [w_H(n) \ w_H(n+1) \ \ldots \ w_H(n+N-1)]^T \\ w_H(k) = [\hat{y}_H(k) \ |\hat{y}_L(k)|^2 \hat{y}_H(k) \ |\hat{y}_H(k)|^2 \hat{y}_H(k) \ \ldots \ |\hat{y}_L(k)|^{2P}|\hat{y}_H(k)|^{2Q} \hat{y}_H(k)] \} \quad (30)$$

Incidentally, a superscript H represents a Hermitian transpose (to transpose the matrix and take a complex conjugate of components thereof), and a superscript −1 represents an inverse matrix in Formula 28.

Vectors $z_L$ and $z_H$ in Formula 28 are vectors obtained from the transmission signal $x_L(n)$ of the band A and the transmission signal $x_H(n)$ of the band B and including signals, after having been subjected to the odd-order distortion compensation processing and before being subjected to the coefficient updating, and are each expressed the following Formula 31.

$$z_L = [z_L(n) \ z_L(n+1) \ \ldots \ z_L(n+N-1)]^T \\ z_L(n) = \sum_{p=0}^{P} \sum_{q=0}^{Q} A_{p,q} |x_L(n)|^{2p} |x_H(n)|^{2q} x_L(n) \\ z_H = [z_H(n) \ z_H(n+1) \ \ldots \ z_H(n+N-1)]^T \\ z_H(n) = \sum_{p=0}^{P} \sum_{q=0}^{Q} B_{p,q} |x_L(n)|^{2p} |x_H(n)|^{2q} x_L(n) \} \quad (31)$$

The odd-order distortion compensation coefficient updating unit 31 illustrated in FIG. 1 supplies the updated odd-order distortion compensation coefficients (distortion compensation coefficient vectors ˆA and ˆB) to the odd-order distortion compensation unit 33. The odd-order distortion compensation unit 33 receives a transmission signal $x_L(n)$ of the band A and a transmission signal $x_H(n)$ of the band B.

The odd-order distortion compensation unit 33 uses the transmission signal $x_L(n)$ of the band A, the transmission signal $x_H(n)$ of the band B, and the odd-order distortion compensation coefficient (ˆA) to generate the odd-order distortion compensation signal $\hat{z}_L(n)$ of the band A (the center frequency $f_A$) as expressed in Formula 32. The odd-order distortion compensation unit 33 uses the transmission signal $x_L(n)$ of the band A, the transmission signal $x_H(n)$ of the band B, and the odd-order distortion compensation coefficient (ˆB) to generate the odd-order distortion compensation signal $\hat{z}_H(n)$ of the band B (the center frequency $f_B$) as expressed in following Formula 32.

$$\hat{z}_L(n) = \sum_{p=0}^{P} \sum_{q=0}^{Q} \hat{A}_{p,q} |x_L(n)|^{2p} |x_H(n)|^{2q} x_L(n) \\ \hat{z}_H(n) = \sum_{p=0}^{P} \sum_{q=0}^{Q} \hat{B}_{p,q} |x_L(n)|^{2p} |x_H(n)|^{2q} x_H(n) \} \quad (32)$$

Similarly, the even-order distortion compensation coefficient updating unit 32 receives the even-order distortion feedback signal replica $\hat{y}_{H-L}(n)$ and the even-order distortion feedback signal replica $\hat{y}_{L,2}(n)$ from the even-order distortion feedback signal replica generation unit 82. The even-order distortion compensation coefficient updating unit 32 receives the transmission signal $x_L(n)$ of the band A and the transmission signal $x_H(n)$ of the band B. The even-order distortion compensation coefficient updating unit 32 performs even-order distortion compensation signal processing using the even-order distortion feedback signal replica $\hat{y}_{H-L}(n)$, the even-order distortion feedback signal replica $\hat{y}_{L,2}(n)$, the transmission signal $x_L(n)$ of the band A and the transmission signal $x_H(n)$ of the band B. That is, the even-order distortion compensation coefficient updating unit 32 performs calculation as expressed in the following Formula 33 to update the distortion compensation coefficient vectors ˆC and ˆD.

$$\hat{C} = (U_{H-L}^H U_{H-L})^{-1} U_{H-L}^H (-\hat{y}_{H-L}) \\ \hat{D} = (U_{L,2}^H U_{L,2})^{-1} U_{L,2}^H (-\hat{y}_{L,2}) \} \quad (33)$$

The distortion compensation coefficient vectors ˆC and ˆD in Formula 33 represent the updated even-order distortion compensation coefficients and are expressed as in the following Formula 34.

$$\hat{C} = [\hat{C}_{0,0} \ \ldots \ \hat{C}_{P,Q}]^T \\ \hat{D} = [\hat{D}_{0,0} \ \ldots \ \hat{D}_{P,Q}]^T \} \quad (34)$$

Matrices $U_{H-L}$ and $U_{L,2}$ in Formula 33 are matrices obtained from the transmission signal $x_L(n)$ of the band A and the transmission signal $x_H(n)$ of the band B and including the even-order terms of the transmission signals of the respective bands, and are expressed by the following Formula 35.

$$U_{H-L} = [u_{H-L}(n)\ u_{H-L}(n+1)\ ...\ u_{H-L}(n+N-1)]^T \qquad (35)$$

$$u_{H-L}(k) = \begin{bmatrix} \{x_L(k)\}^* x_H(k) & |x_L(k)|^2 \{x_L(k)\}^* x_H(k) & |x_H(k)|^2 \{x_L(k)\}^* x_H(k) \\ & ... & |x_L(k)|^{2P} |x_H(k)|^{2Q} \{x_L(k)\}^* x_H(k) \end{bmatrix}$$

$$U_{L,2} = [u_{L,2}(n)\ u_{L,2}(n+1)\ ...\ u_{L,2}(n+N-1)]^T$$

$$u_{L,2}(k) = \begin{bmatrix} \{x_L(k)\}^2 & |x_L(k)|^2 \{x_L(k)\}^2 & |x_H(k)|^2 \{x_L(k)\}^2 & ... \\ & |x_L(k)|^{2P} |x_H(k)|^{2Q} \{x_L(k)\}^2 \end{bmatrix}$$

Incidentally, a superscript H represents a Hermitian transpose (to transpose the matrix and take a complex conjugate of components thereof), and a superscript −1 represents an inverse matrix in Formula 33.

Vectors $\hat{y}_{H-L}$ and $\hat{y}_{L,2}$ in Formula 33 are obtained from the even-order distortion feedback signal replica $\hat{y}_{H-L}(n)$ and the even-order distortion feedback signal replica $\hat{y}_{L,2}(n)$. The vectors $\hat{y}_{H-L}$ and $\hat{y}_{L,2}$ are vectors including the even-order distortion feedback signal after separation and are expressed by the following Formula 36.

$$\hat{y}_{H-L} = [\hat{y}_{H-L}(n)\ \hat{y}_{H-L}(n+1)\ ...\ \hat{y}_{H-L}(n+N-1)]^T \qquad (36)$$
$$\hat{y}_{L,2} = [\hat{y}_{L,2}(n)\ \hat{y}_{L,2}(n+1)\ ...\ \hat{y}_{L,2}(n+N-1)]^T$$

The even-order distortion compensation coefficient updating unit 32 illustrated in FIG. 1 supplies the updated even-order distortion compensation coefficients (distortion compensation coefficient vectors ˆC and ˆD) to the even-order distortion compensation unit 34. The even-order distortion compensation unit 34 receives the transmission signal $x_L(n)$ of the band A and the transmission signal $x_H(n)$ of the band B. The even-order distortion compensation unit 34 uses the transmission signal $x_L(n)$ of the band A, the transmission signal $x_H(n)$ of the band B, and the even-order distortion compensation coefficient (ˆC) to generate an even-order distortion compensation signal $\hat{z}_{H-L}(n)$ of the center frequency $f_C = f_B - f_A$ as expressed in the following Formula 37. The even-order distortion compensation unit 34 uses the transmission signal $x_L(n)$ of the band A, the transmission signal $x_H(n)$ of the band B, and the even-order distortion compensation coefficient (ˆD) to generate the even-order distortion compensation signal $\hat{z}_{L,2}(n)$ of the center frequency $f_D = 2f_A$ as expressed in the following Formula 37.

$$\hat{z}_{H-L}(n) = z_{H-L}(n) + \sum_{p=0}^{P}\sum_{q=0}^{Q} \hat{C}_{p,q} |x_L(n)|^{2p} |x_H(n)|^{2q} \{x_L(k)\}^* x_H(n) \qquad (37)$$

$$\hat{z}_{L,2}(n) = z_{L,2}(n) + \sum_{p=0}^{P}\sum_{q=0}^{Q} \hat{D}_{p,q} |x_L(n)|^{2p} |x_H(n)|^{2q} \{x_L(n)\}^2$$

Incidentally, when Formulas 13 to 16 and Formulas 22 to 26 are compared, a relationship as expressed in the following Formula 38 is established.

$$\hat{C}_{p,q} = -\hat{c}_{p,q} \qquad (38)$$
$$\hat{D}_{p,q} = -\hat{d}_{p,q}$$

The even-order distortion compensation unit 34 may use coefficients ˆ$C_{p,q}$ and ˆ$D_{p,q}$ obtained by the relationship of Formula 38 to generate the signals $\hat{z}_{H-L}(n)$ and $\hat{z}_{L,2}(n)$ after having been subjected to the even-order distortion compensation processing according to Formula 37.

Figure 4:
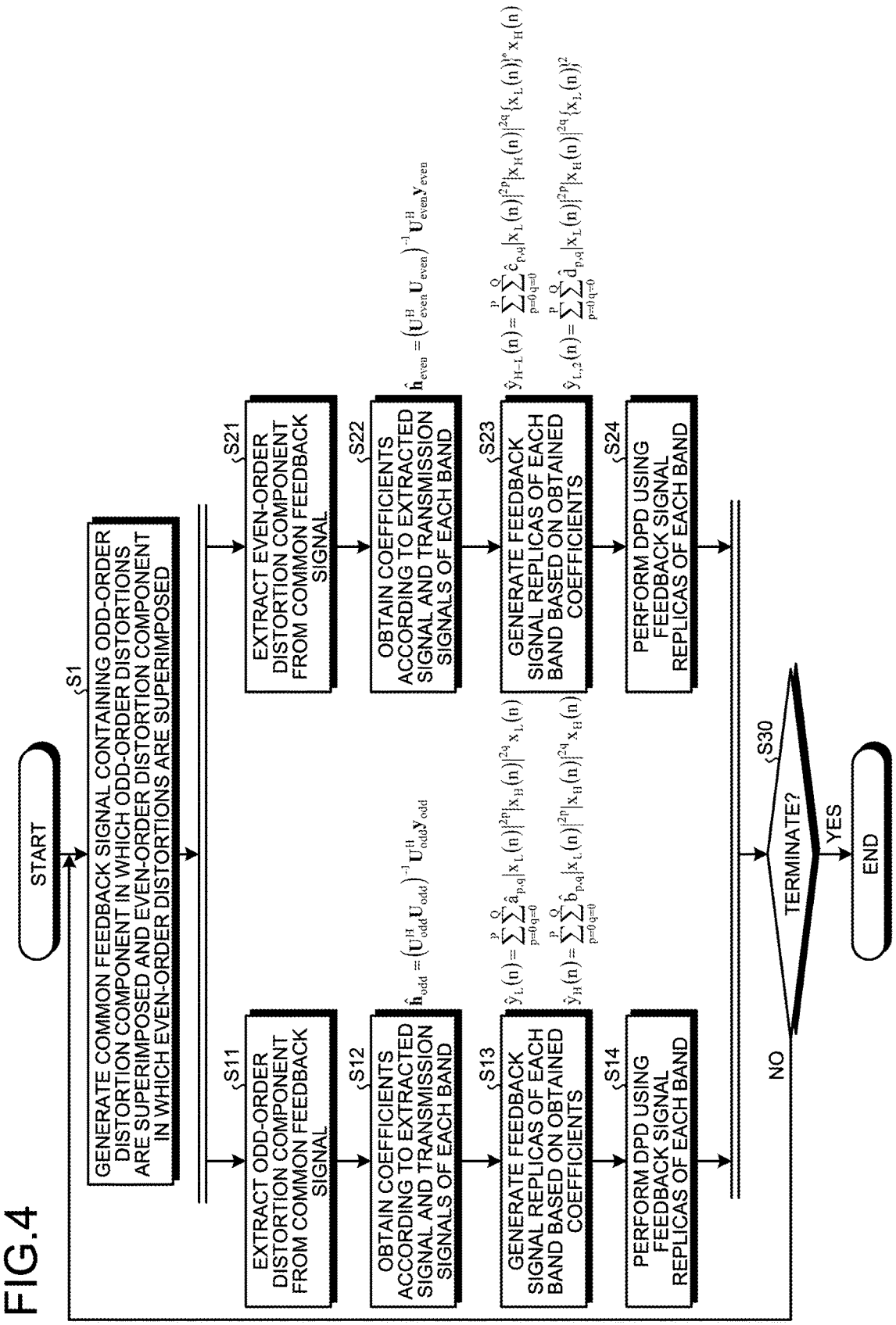
FIG. 4 is a flowchart illustrating an operation of the distortion compensation apparatus according to the embodiment.

Next, an operation of the distortion compensation apparatus 1 will be described with reference to FIG. 4. FIG. 4 is a flowchart illustrating the operation of the distortion compensation apparatus 1.

In the distortion compensation apparatus 1, when receiving a signal according to the output of the power amplifier 40, the common feedback unit 10 generates the common feedback signal containing the odd-order distortion component in which the plurality of odd-order distortions are superimposed and the even-order distortion component in which the plurality of even-order distortions are superimposed from the signal (S1). When the common feedback signal processor 70 receives the common feedback signal from the common feedback unit 10, processing (S11 to S14) for the odd-order distortion and processing (S21 to S24) for the even-order distortion are performed in parallel.

In the processing for the odd-order distortion, the generation unit 91 of the common feedback signal processor 70 extracts the odd-order distortion component from the common feedback signal (S11). The generation unit 91 obtains the coefficient vector ˆ$h_{odd}$ containing the amplifier model coefficients ˆ$a_{p,q}$ and ˆ$b_{p,q}$ according to the extracted signal and the transmission signals of the respective bands by the calculation expressed in Formula 17 (S12). The generation unit 91 generates the odd-order distortion feedback signal replicas ˆ$y_L(n)$ and ˆ$y_H(n)$ corresponding to the respective bands A and B using the amplifier model coefficients ˆ$a_{p,q}$ and ˆ$b_{p,q}$ by the calculation expressed in Formulas 18 and 19 (S13). The generation unit 91 supplies the odd-order distortion feedback signal replicas ˆ$y_L(n)$ and ˆ$y_H(n)$ to the odd-order distortion compensation coefficient updating unit 31. The odd-order distortion compensation coefficient updating unit 31 updates the odd-order distortion compensation coefficient using the odd-order distortion feedback signal replicas ˆ$y_L(n)$ and ˆ$y_H(n)$, and supplies the updated odd-order distortion compensation coefficients (ˆA and ˆB) to the odd-order distortion compensation unit 33. The odd-order distortion compensation unit 33 performs DPD processing to compensate for the odd-order distortion using the updated odd-order distortion compensation coefficients (ˆA and ˆB) (S14).

In the processing for the even-order distortion, the generation unit 92 of the common feedback signal processor 70 extracts the even-order distortion component from the common feedback signal (S21). The generation unit 92 obtains the coefficient vector ˆ$h_{even}$ containing the amplifier model coefficients ˆ$c_{p,q}$ and ˆ$d_{p,q}$ according to the extracted signal and the transmission signals of the respective bands by the calculation expressed in Formula 25 (S22). The generation unit 92 generates the even-order distortion feedback signal replicas ˆ$y_{H-L}(n)$ and $y_{L,2}(n)$ corresponding to the respective bands A and B using the amplifier model coefficients ˆ$c_{p,q}$ and ˆ$d_{p,q}$ by the calculation expressed in Formulas 26 and 27 (S23). The generation unit 92 supplies the even-order distortion feedback signal replicas ˆ$y_{H-L}(n)$ and ˆ$y_{L,2}(n)$ to the even-order distortion compensation coefficient updating unit 32. The even-order distortion compensation coefficient updating unit 32 updates the even-order distortion compensation coefficient using the even-order distortion feedback signal replicas ˆ$y_{H-L}(n)$ and ˆ$y_{L,2}(n)$, and supplies the updated even-order distortion compensation coefficient (ˆC and ˆD) to the even-order distortion compensation unit 34.

The even-order distortion compensation unit 34 performs DPD processing to compensate for the even-order distortion using the updated even-order distortion compensation coefficients (^C and ^D) (S24).

The distortion compensation apparatus 1 repeats the processing from S1 to S24 until receiving an instruction of termination (No in S30), and ends the processing when receiving the instruction of termination (Yes in S30).

As described above, the distortion compensation apparatus 1 that compensates for the nonlinear distortion generated when the power amplifier 40 amplifies the multi-band signal is provided with the common feedback unit 10 that performs common feedback of the odd-order distortion (main signal band) and the even-order distortion in a superimposed manner. Thus, the feedback system is configured in the distortion compensation apparatus 1 such that the common feedback signal in which the odd-order distortions are superimposed and the even-order distortions are superimposed is generated and the frequency conversion and the AD conversion are performed in common. Accordingly, it is possible to reduce the number of analog components such as the down-converter (frequency converter) and the ADC, and to easily reduce the circuit scale of the feedback system in the distortion compensation apparatus 1.

In addition, the common feedback signal processor 70 performs the signal processing by separating the odd-order distortion component and the even-order distortion component from the common feedback signal generated by the common feedback unit 10 in the distortion compensation apparatus 1 in the embodiment. Accordingly, it is possible to reduce the circuit scale of the feedback system in the distortion compensation apparatus 1, and to compensate for each of the odd-order distortion and the even-order distortion.

Modification 1

Figure 5:
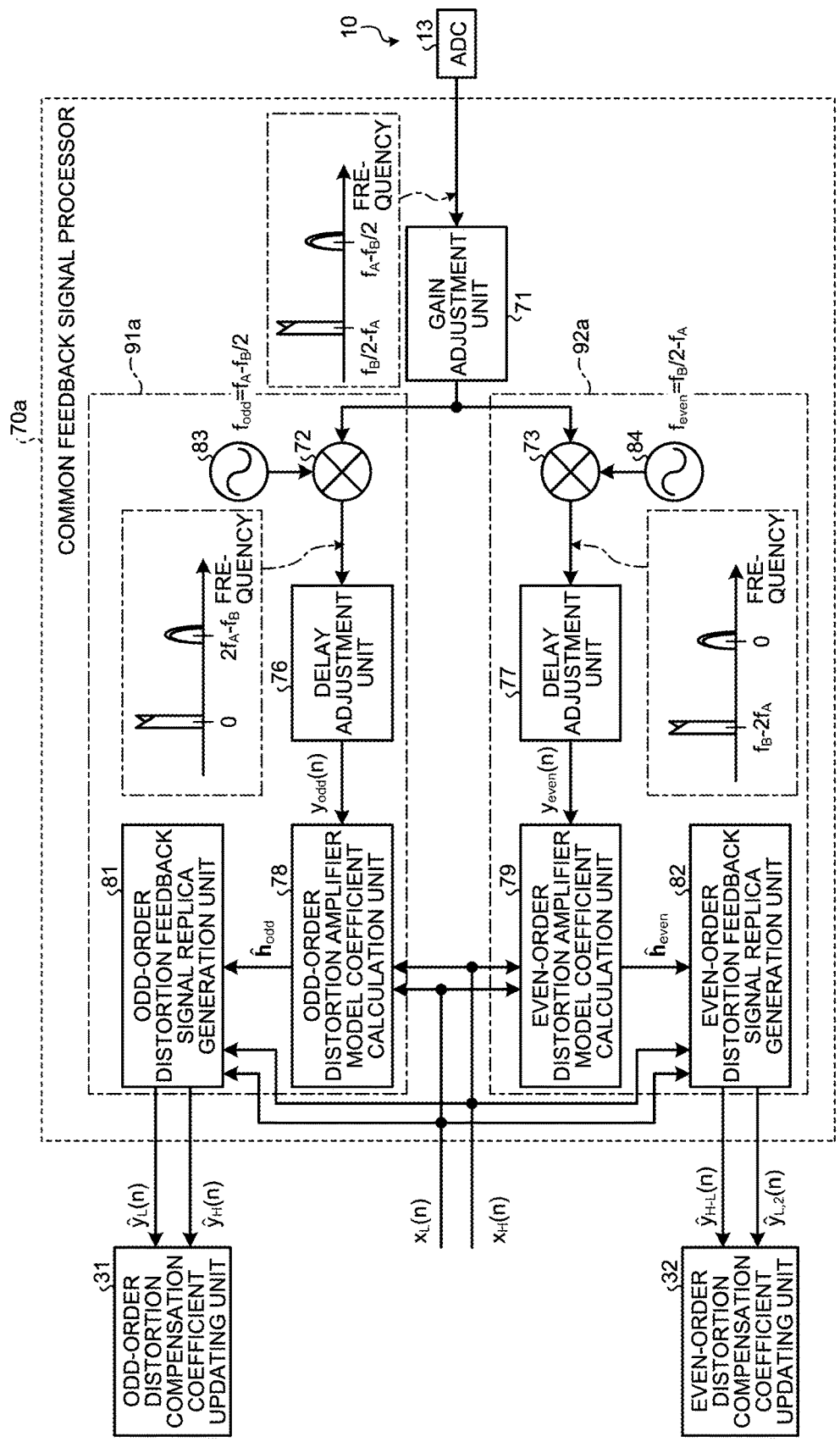
FIG. 5 is a diagram illustrating a configuration of a common feedback signal processor according to Modification 1.

Incidentally, generation units 91a and 92a of a common feedback signal processor 70a may be configured such that the LPFs 74 and 75 (see FIG. 3) are omitted as illustrated in FIG. 5. FIG. 5 is a diagram illustrating the configuration of the common feedback signal processor 70a according to Modification 1. For example, if it may be assumed that an odd-order distortion and an even-order distortion have low correlation with each other, one of the odd-order distortion and the even-order distortion is regarded as noise of the other. Thus, when a large number of samples of the feedback signal, used for calculation of coefficients in the odd-order distortion amplifier model coefficient calculation unit 78 and the even-order distortion amplifier model coefficient calculation unit 79, are secured, it is possible to cancel the other distortion even if the filtering processing using the LPF is omitted.

For example, the large number of samples of the odd-order distortion common feedback signal $y_{odd}(n)$, used for calculation of the coefficient vector $\hat{h}_{odd}$ by the odd-order distortion amplifier model coefficient calculation unit 78, are secured (N in Formulas 14 and 15 is set to be large) in the generation unit 91a. In this case, an amplitude of the even-order distortion component at a fluctuating frequency position may be smaller when being time-averaged than that of the odd-order distortion component in the vicinity of 0 Hz. Accordingly, it is possible to substantially regard that the mixer 72 extracts the odd-order distortion component from the common feedback signal, in the generation unit 91a.

For example, the number of samples of the even-order distortion common feedback signal $y_{even}(n)$ is secured to be large (to make N in Formulas 22 and 23 large), used for calculation of the coefficient vector $\hat{h}_{even}$ by the even-order distortion amplifier model coefficient calculation unit 79, in the generation unit 92a. In this case, the amplitude of the odd-order distortion component at the fluctuating frequency position may be smaller when being time-averaged than that of the even-order distortion component in the vicinity of 0 Hz. Accordingly, it is possible to substantially regard that the mixer 73 extracts the even-order distortion component from the common feedback signal, in the generation unit 92a.

In this manner, the odd-order distortion component and the even-order distortion component are each substantially separated by the mixers 72 and 73 by securing the large number (N) of samples of the signal used for calculation of coefficients in the odd-order distortion amplifier model coefficient calculation unit 78 and the even-order distortion amplifier model coefficient calculation unit 79. Accordingly, it is possible to separate each of the odd-order distortion component and the even-order distortion component from the common feedback signal when the odd-order distortion (main signal band) and the even-order distortion are substantially superimposed on each other in the common feedback signal.

In addition, it is possible to simplify the configuration of the common feedback signal processor 70a and to reduce the cost since the LPFs 74 and 75 (see FIG. 3) are omitted in this configuration.

Modification 2

Figure 6:
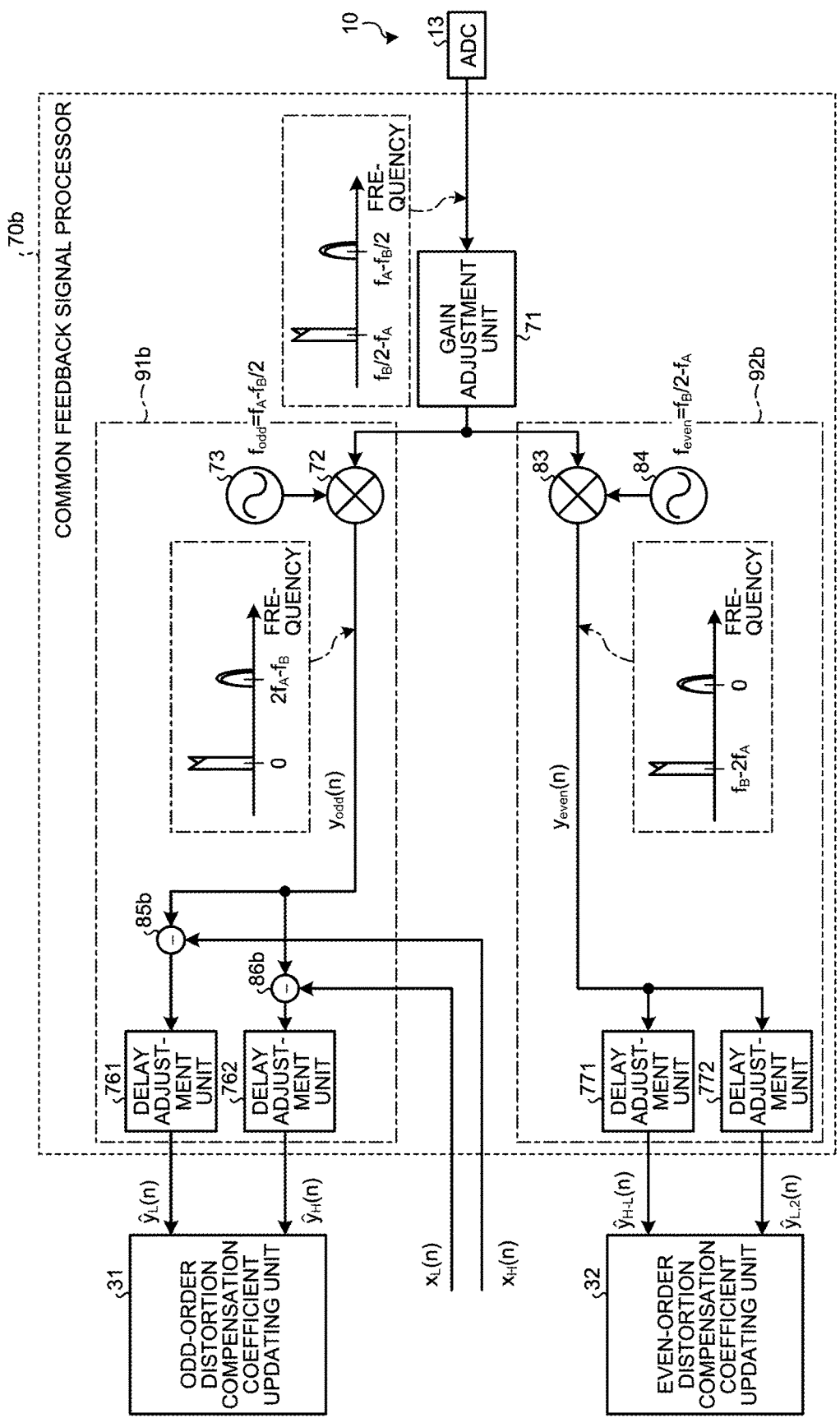
FIG. 6 is a diagram illustrating a configuration of a common feedback signal processor according to Modification 2.

Alternatively, generation units 91b and 92b of a common feedback signal processor 70b may be configured so as not to use a feedback signal replica as illustrated in FIG. 6. FIG. 6 is a diagram illustrating the configuration of the common feedback signal processor 70b according to Modification 2. For example, under a condition that it may be assumed that "odd-order distortions have low correlation with each other" and "even-order distortions have low correlation with each other" in addition to the assumption that "the odd-order distortion and the even-order distortion have low correlation with each other" in Modification 1, a component other than the component of interest may be regarded as noise. Thus, it is possible to cancel the distortion by securing a large number of samples.

Specifically, the generation unit 91b is obtained by omitting the delay adjustment unit 76, the odd-order distortion amplifier model coefficient calculation unit 78, and the odd-order distortion feedback signal replica generation unit 81 from the generation unit 91a (see FIG. 5). The generation unit 91b is obtained by adding a subtractor (first subtraction unit) 85b, a subtractor (second subtraction unit) 86b, a delay adjustment unit 761, and a delay adjustment unit 762 to the generation unit 91a (see FIG. 5). The fact that it is possible to substantially regard that the mixer 72 extracts the odd-order distortion component from the common feedback signal by securing the large number of samples is the same as in Modification 1. It is possible to express the odd-order distortion common feedback signal $y_{odd}(n)$ which has been frequency-converted by the mixer 72 by the following Formula 39.

$$\begin{aligned} y_{odd}(n) &= \hat{y}_L(n) + \hat{y}_H(n) \\ &= (x_L(n) + \Delta y_L(n)) + (x_H(n) + \Delta y_H(n)) \end{aligned} \quad (39)$$

In Formula 39, a distortion component $\Delta y_H(n)$ on the high band $BW_H$ (see FIG. 2) side may be regarded as noise from the odd-order distortion feedback signal $\hat{y}_L(n)$ on the low band $BW_L$ (see FIG. 2). Thus, when Formula 39 is solved with respect to the odd-order distortion feedback signal $\hat{y}_L(n)$, the following Formula 40 is approximately established.

$$\hat{y}_L(n) \approx y_{odd}(n) - x_H(n) \quad (40)$$

Therefore, the subtractor 85b is capable of generating the odd-order distortion feedback signal $\hat{y}_L(n)$ by subtracting the transmission signal $x_H(n)$ on the high band $BW_H$ side from the odd-order distortion common feedback signal $y_{odd}(n)$ in the generation unit 91b.

The delay adjustment unit 761 delays the odd-order distortion feedback signal $\hat{y}_L(n)$ output from the subtractor 85b by a predetermined delay amount and supplies the delayed signal to the odd-order distortion compensation coefficient updating unit 31.

In Formula 39, the distortion component $\Delta y_L(n)$ on the low band $BW_L$ (see FIG. 2) side may be regarded as noise from the odd-order distortion feedback signal $\hat{y}_H(n)$ on the high band $BW_H$ (see FIG. 2). Thus, when Formula 39 is solved with respect to the odd-order distortion feedback signal $\hat{y}_H(n)$, the following Formula 41 is approximately established.

$$\hat{y}_H(n) \approx y_{odd}(n) - x_L(n) \quad (41)$$

Therefore, the subtractor 86b is capable of generating the odd-order distortion feedback signal $\hat{y}_H(n)$ by subtracting the transmission signal $x_L(n)$ on the low band $BW_L$ side from the odd-order distortion common feedback signal $y_{odd}(n)$ in the generation unit 91b.

The delay adjustment unit 762 delays the odd-order distortion feedback signal $\hat{y}_H(n)$ output from the subtractor 86b by a predetermined delay amount and supplies the delayed signal to the odd-order distortion compensation coefficient updating unit 31.

The generation unit 92b is obtained by omitting the delay adjustment unit 77, the even-order distortion amplifier model coefficient calculation unit 79, and the even-order distortion feedback signal replica generation unit 82 and adding a delay adjustment unit 771 and a delay adjustment unit 772, with respect to the generation unit 92a (see FIG. 5). The fact that it is possible to substantially regard that the mixer 73 extracts the even-order distortion component from the common feedback signal by securing the large number of samples is the same as in Modification 1. The even-order distortion common feedback signal $y_{even}(n)$ which has been frequency-converted by the mixer 73 is supplied to each of the delay adjustment unit 771 and the delay adjustment unit 772.

The delay adjustment unit 771 delays the even-order distortion common feedback signal $y_{even}(n)$ by a predetermined delay amount and supplies the delayed signal to the even-order distortion compensation coefficient updating unit 32 as the even-order distortion feedback signal $\hat{y}_{H\text{-}L}(n)$.

The delay adjustment unit 772 delays the even-order distortion common feedback signal $y_{even}(n)$ by a predetermined delay amount and supplies the delayed signal to the even-order distortion compensation coefficient updating unit 32 as the even-order distortion feedback signal $\hat{y}_{L,2}(n)$.

In this manner, odd-order distortion compensation signal processing is performed using a signal obtained by subtracting the other transmission signal from the frequency-shifted common feedback signal without using the feedback signal replica, and even-order distortion compensation signal processing is performed using the frequency-shifted common feedback signal. Accordingly, it is possible to omit the configurations such as the odd-order distortion amplifier model coefficient calculation unit 78, the odd-order distortion feedback signal replica generation unit 81, the even-order distortion amplifier model coefficient calculation unit 79, and the even-order distortion feedback signal replica generation unit 82. As a result, it is possible to further simplify the configuration of the common feedback signal processor 70b and to further reduce the cost.

Modification 3

Modification 2 operates appropriately when both a first condition and a second condition are satisfied. The first condition is that amplitudes and phases of the transmission signal $x_H(n)$ to be subtracted and the transmission signal component $x_H(n)$ on the high band $BW_H$ (see FIG. 2) side contained in the odd-order distortion common feedback signal $y_{odd}(n)$ almost completely match each other. The second condition is that amplitudes and phases of the transmission signal $x_L(n)$ to be subtracted and the transmission signal component $x_L(n)$ on the low band $BW_L$ (see FIG. 2) side contained in the odd-order distortion common feedback signal $y_{odd}(n)$ almost completely match each other. However, the appropriate operation is not guaranteed in a case where at least one of the first condition and the second condition is not satisfied.

Therefore, a distortion compensation coefficient is calculated using a transmission signal instead of a feedback signal replica in Modification 3 in order to avoid such a problem. Specifically, the matrices $W_L$ and $W_H$ in Formula 28 are obtained by the following Formula 42 instead of Formula 30.

$$\begin{aligned} W_L &= [w_L(n)\ w_L(n+1)\ \ldots\ w_L(n+N-1)]^T \\ w_L(k) &= [\hat{y}_L(k)\ |x_L(k)|^2 \hat{y}_L(k)\ |x_H(k)|^2 \hat{y}_L(k)\ \ldots\ |x_L(k)|^{2P}|x_H(k)|^{2Q}\hat{y}_L(k)] \\ W_H &= [w_H(n)\ w_H(n+1)\ \ldots\ w_H(n+N-1)]^T \\ w_H(k) &= [\hat{y}_H(k)\ |x_L(k)|^2 \hat{y}_H(k)\ |x_H(k)|^2 \hat{y}_H(k)\ \ldots\ |x_L(k)|^{2P}|x_H(k)|^{2Q}\hat{y}_H(k)] \end{aligned} \quad (42)$$

A difference of Formula 42 from Formula 30 is that content of an absolute value is taken using the transmission signals $x_L(n)$ and $x_H(n)$ instead of the odd-order distortion feedback signal replicas $\hat{y}_L(n)$ and $\hat{y}_H(n)$.

Figure 7A:
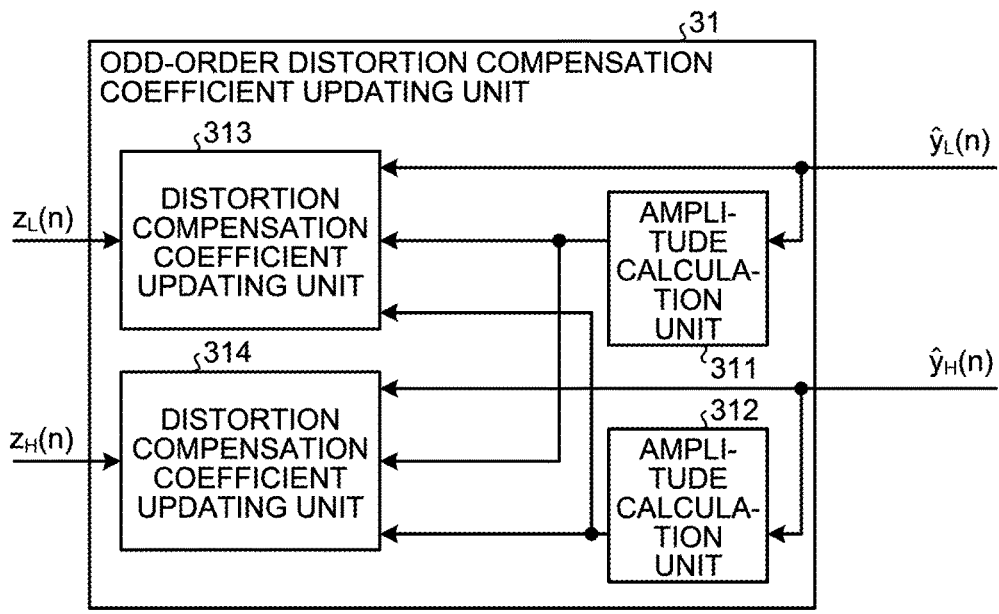
FIGS. 7A and 7B are diagrams illustrating configurations of the odd-order distortion compensation coefficient updating units according to Modification 2 and Modification 3.
Figure 7B:
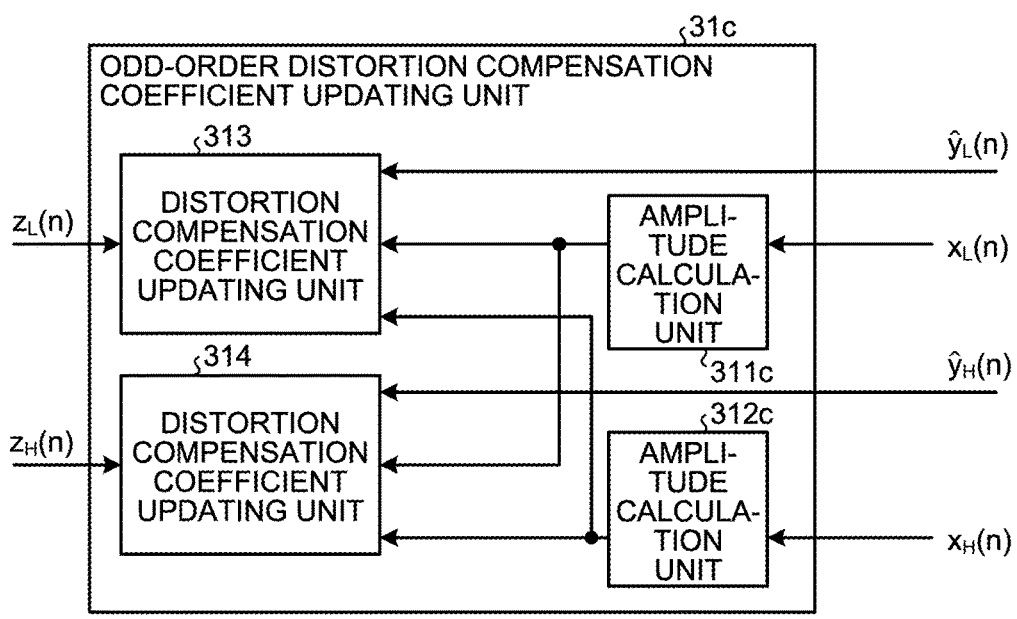

That is, an inverse characteristic is obtained using amplitude information of the odd-order distortion feedback signal replicas $\hat{y}_L(n)$ and $\hat{y}_H(n)$ in Modification 2 as illustrated in FIG. 7A. On the contrary, the inverse characteristic is obtained using amplitude information of the transmission signals $x_L(n)$ and $x_H(n)$ in Modification 3 as illustrated in FIG. 7B.

In the odd-order distortion compensation coefficient updating unit 31 illustrated in FIG. 7A, an amplitude calculation unit 311 obtains an amplitude $|\hat{y}_L(n)|$ of the odd-order distortion feedback signal replica $\hat{y}_L(n)$ and supplies the amplitude to distortion compensation coefficient updating units 313 and 314. An amplitude calculation unit 312 obtains an amplitude $|\hat{y}_H(n)|$ of the odd-order distortion feedback signal replica $\hat{y}_H(n)$ and supplies the amplitude to the distortion compensation coefficient updating units 313 and 314.

The distortion compensation coefficient updating unit 313 receives the odd-order distortion compensation signal $z_L(n)$ from the odd-order distortion compensation unit 33. The distortion compensation coefficient updating unit 313 obtains the matrix $W_L$ according to Formula 30 and obtains the odd-order distortion compensation coefficient ($\hat{A}$)

according to Formula 28 using the odd-order distortion compensation signal $z_L(n)$ and the matrix $W_L$.

The distortion compensation coefficient updating unit 314 receives the odd-order distortion compensation signal $z_H(n)$ from the odd-order distortion compensation unit 33. The distortion compensation coefficient updating unit 314 obtains the matrix $W_H$ according to Formula 30 and obtains the odd-order distortion compensation coefficient (^B) according to Formula 28 using the odd-order distortion compensation signal $z_H(n)$ and the matrix $W_H$.

On the other hand, in an odd-order distortion compensation coefficient updating unit 31c illustrated in FIG. 7B, an amplitude calculation unit 311c obtains an amplitude $|x_L(n)|$ of the transmission signal $x_L(n)$ of the band A and supplies the amplitude to the distortion compensation coefficient updating units 313 and 314. An amplitude calculation unit 312c obtains an amplitude $|x_H(n)|$ of the transmission signal $x_H(n)$ of the band B and supplies the amplitude to the distortion compensation coefficient updating units 313 and 314.

The distortion compensation coefficient updating unit 313 receives the odd-order distortion compensation signal $z_L(n)$ from the odd-order distortion compensation unit 33. The distortion compensation coefficient updating unit 313 obtains the matrix $W_L$ according to Formula 42 and obtains the odd-order distortion compensation coefficient (^A) according to Formula 28 using the odd-order distortion compensation signal $z_L(n)$ and the matrix $W_L$.

The distortion compensation coefficient updating unit 314 receives the odd-order distortion compensation signal $z_H(n)$ from the odd-order distortion compensation unit 33. The distortion compensation coefficient updating unit 314 obtains the matrix $W_H$ according to Formula 42 and obtains the odd-order distortion compensation coefficient (^B) according to Formula 28 using the odd-order distortion compensation signal $z_H(n)$ and the matrix $W_H$.

Since the distortion compensation coefficient is calculated using the transmission signals $x_L(n)$ and $x_H(n)$ instead of the odd-order distortion feedback signal replicas $\hat{y}_L(n)$ and $\hat{y}_H(n)$ in this manner, it is possible to update the distortion compensation coefficient while causing the distortion compensation coefficient to further follow the transmission signal $x_L(n)$ and $x_H(n)$.

Modification 4

Modification 2 operates appropriately when both the first condition and the second condition are satisfied. The first condition is that amplitudes and phases of the transmission signal $x_H(n)$ to be subtracted and the transmission signal component $x_H(n)$ on the high band $BW_H$ (see FIG. 2) side contained in the odd-order distortion common feedback signal $y_{odd}(n)$ almost completely match each other. The second condition is that amplitudes and phases of the transmission signal $x_L(n)$ to be subtracted and the transmission signal component $x_L(n)$ on the low band $BW_L$ (see FIG. 2) side contained in the odd-order distortion common feedback signal $y_{odd}(n)$ almost completely match each other. However, the appropriate operation is not guaranteed in a case where at least one of the first condition and the second condition is not satisfied.

Therefore, odd-order distortion compensation signal processing is performed only with the first-order term at first (the first sampling) for initial value detection, and the same processing as in Modification 2 is performed at the second and subsequent sampling in Modification 4 in order to avoid such a problem.

Figure 8:
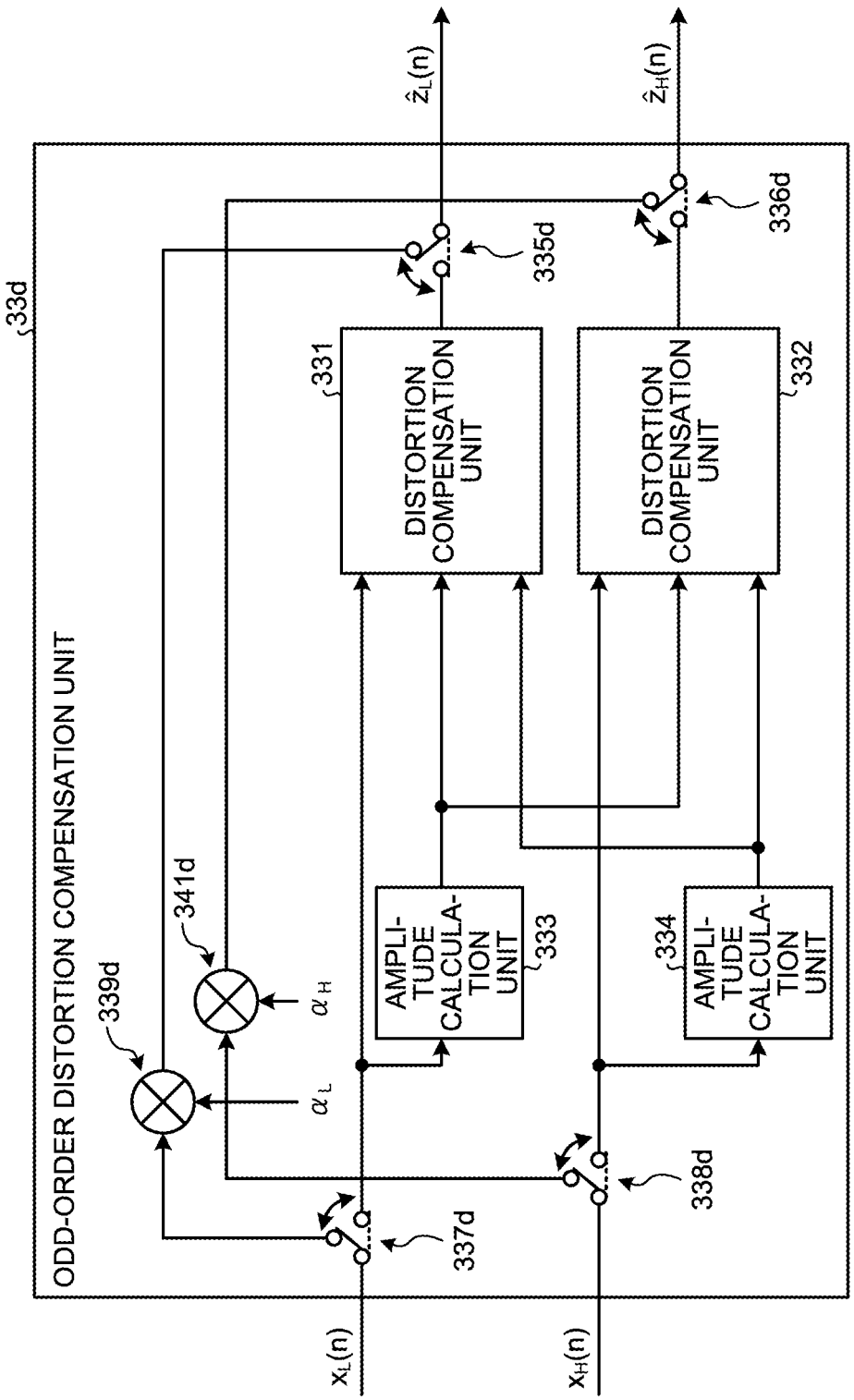
FIG. 8 is a diagram illustrating a configuration of an odd-order distortion compensation unit according to Modification 4.
Figure 9:
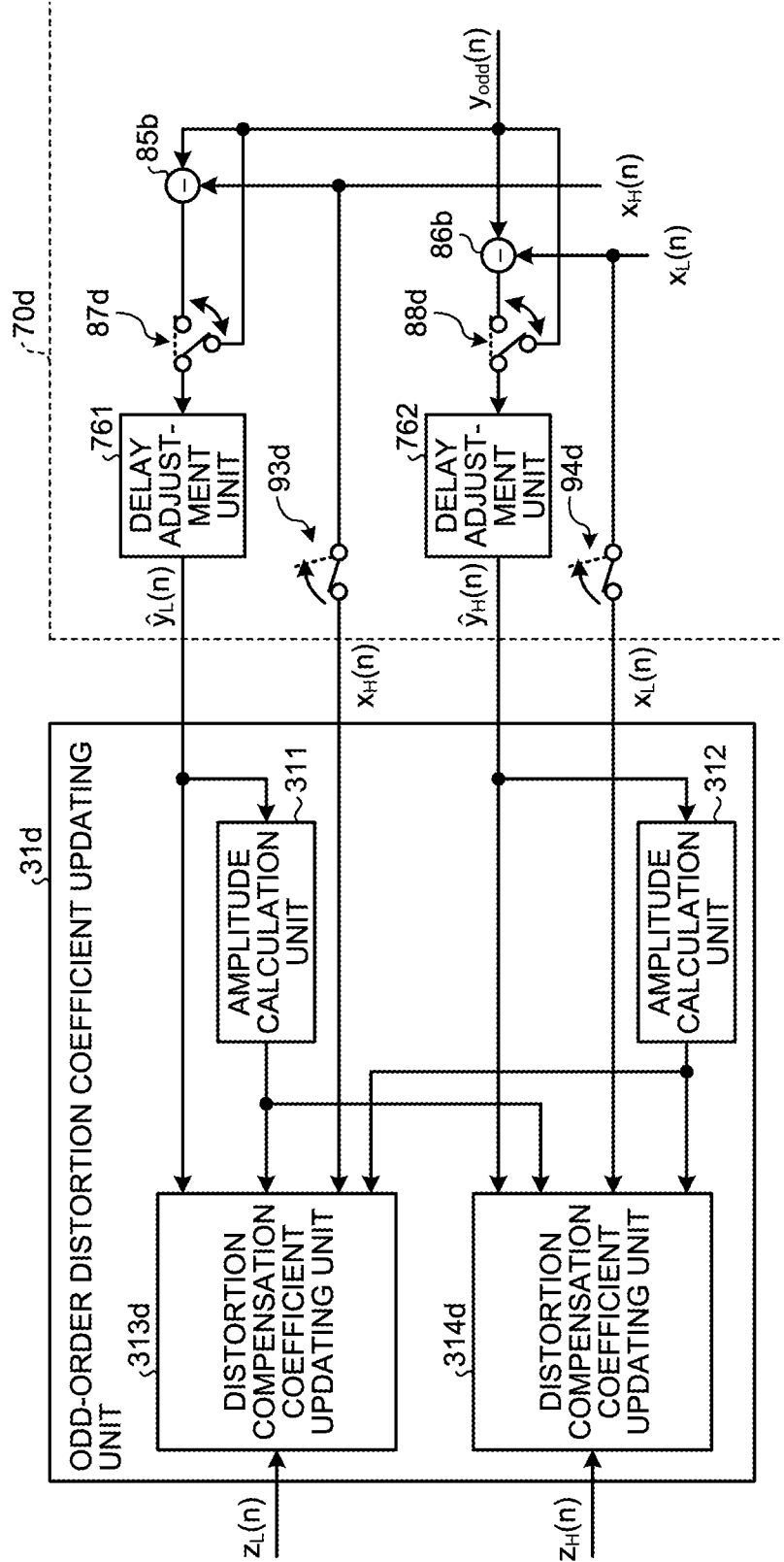
FIG. 9 is a diagram illustrating a configuration of an odd-order distortion compensation coefficient updating unit according to Modification 4.

Specifically, an odd-order distortion compensation unit 33d includes a distortion compensation unit 331, a distortion compensation unit 332, an amplitude calculation unit 333, an amplitude calculation unit 334, a switch 335d, a switch 336d, a switch 337d, a switch 338d, a multiplier 339d, and a multiplier 341d as illustrated in FIG. 8. As illustrated in FIG. 9, an odd-order distortion compensation coefficient updating unit 31d includes a distortion compensation coefficient updating unit 313d, and a distortion compensation coefficient updating unit 314d instead of the distortion compensation coefficient updating unit 313 and the distortion compensation coefficient updating unit 314 (see FIG. 7A) of Modification 2. A common feedback signal processor 70d is obtained by further adding a switch 87d, a switch 88d, a switch 93d, and a switch 94d to the common feedback signal processor 70b (see FIG. 6) of Modification 2.

Figure 10:
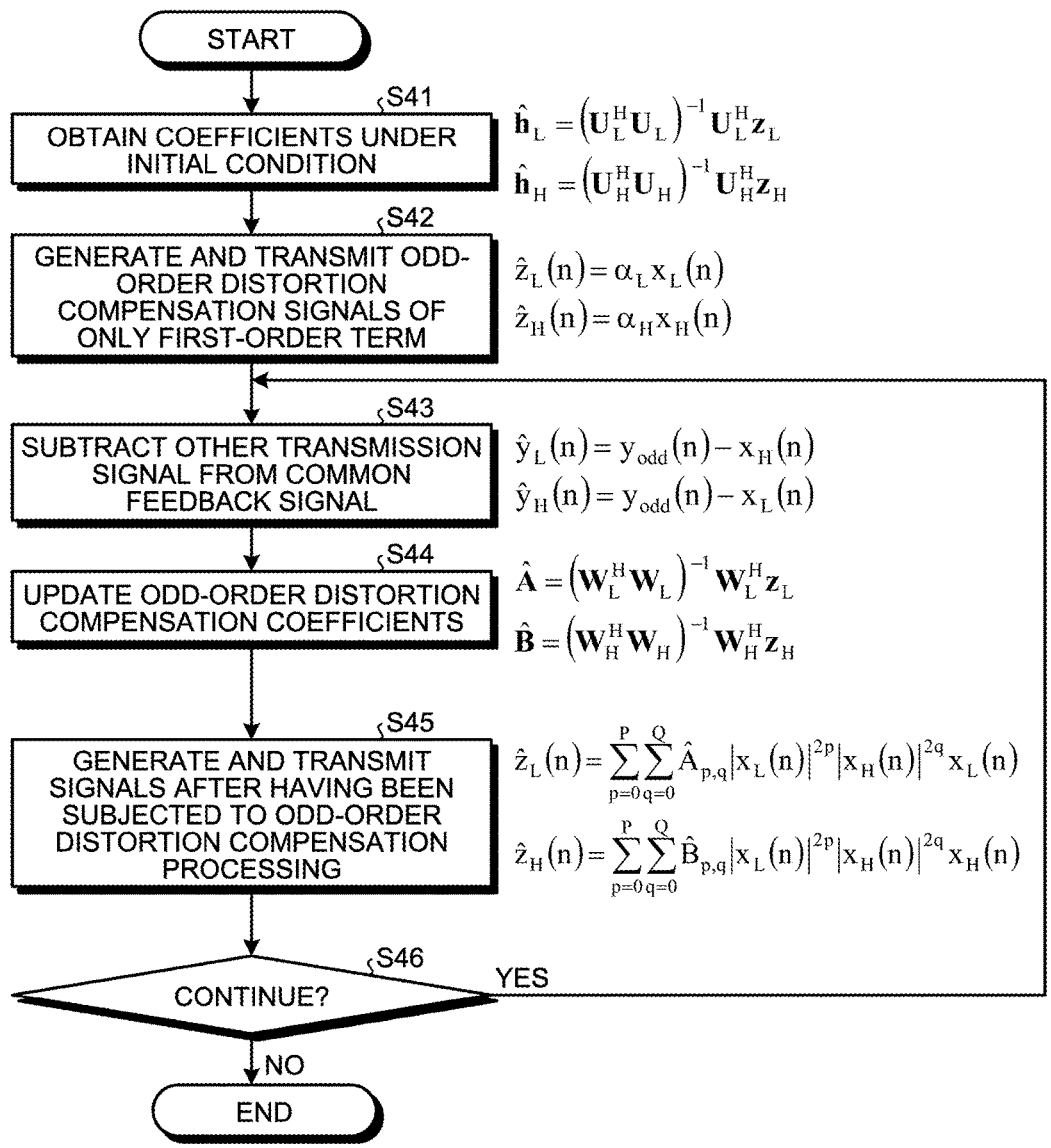
FIG. 10 is a flowchart illustrating operations of the odd-order distortion compensation coefficient updating unit and the odd-order distortion compensation unit according to Modification 4.

Incidentally, FIG. 8 is a diagram illustrating a configuration of the odd-order distortion compensation unit 33d. FIG. 9 is a diagram illustrating a configuration of the odd-order distortion compensation coefficient updating unit 31d. In FIGS. 8 and 9, each of the switches 335d to 338d, 87d, 88d, 93d, and 94d is switched to a state indicated by the solid line at the first sampling. Accordingly, the odd-order distortion compensation coefficient updating unit 31d and the odd-order distortion compensation unit 33d perform processes of detecting initial values (S41 and S42 illustrated in FIG. 10). Each of the switches 335d to 338d, 87d, 88d, 93d, and 94d is switched to a state indicated by the broken line at the second and subsequent sampling. Accordingly, the odd-order distortion compensation coefficient updating unit 31d and the odd-order distortion compensation unit 33d perform the same processes (S43 to S46 illustrated in FIG. 10) as in Modification 2. FIG. 10 is a flowchart illustrating operations of the odd-order distortion compensation coefficient updating unit 31d and the odd-order distortion compensation unit 33d.

For example, the odd-order distortion compensation signal $z_L(n)$ on the low band $BW_L$ (see FIG. 2) side and the odd-order distortion compensation signal $z_H(n)$ on the high band $BW_E$ (see FIG. 2) side are expressed by the following Formula 43 in the first sampling at the time of detecting the initial value.

$$z_L(n) = \alpha_L y_{odd}(n) - \beta_L x_H(n) \brace z_H(n) = \alpha_H y_{odd}(n) - \beta_H x_L(n)} \quad (43)$$

In Formula 43, $y_{odd}(n)$ is the odd-order distortion common feedback signal. At this time, $z_L(n)$ and $z_H(n)$ are expressed by the following Formula 44 if expressed in a matrix form.

$$z_L = U_L h_L \brace z_H = U_H h_H} \quad (44)$$

Further, $z_L$ and $z_H$ in Formula 44 are expressed by the following Formula 45.

$$z_L = [z_L(n)\ z_L(n+1)\ \ldots\ z_L(n+N-1)]^T \brace z_H = [z_H(n)\ z_H(n+1)\ \ldots\ z_H(n+N-1)]^T} \quad (45)$$

Further, $U_L$ and $U_H$ in Formula 44 are expressed by the following Formula 46.

$$U_L = [u_L(n)\ u_L(n+1)\ ...\ u_L(n+N-1)]^T \quad (46)$$
$$u_L(k) = [y_{odd}(k)\ -x_H(k)]$$
$$U_H = [u_H(n)\ u_H(n+1)\ ...\ u_H(n+N-1)]^T$$
$$u_H(k) = [y_{odd}(k)\ -x_L(k)]$$

Further, $h_L$ and $h_H$ in Formula 44 are expressed by the following Formula 47.

$$h_L = [\alpha_L\ \beta_L]^T \quad (47)$$
$$h_H = [\alpha_H\ \beta_H]^T$$

Therefore, $z_L(n)=x_L(n)$ and $z_H(n)=x_H(n)$ are set as initial conditions, and coefficient vectors $\hat{h}_L$, and $\hat{h}_H$ are obtained as expressed by the following Formula 48 (S41).

$$\hat{h}_L = (U_L^H U_L)^{-1} U_L^H z_L \quad (48)$$
$$\hat{h}_H = (U_H^H U_H)^{-1} U_H^H z_H$$

Further, the odd-order distortion compensation signal $\hat{z}_L(n)$ on the low band $BW_L$ (see FIG. 2) side and the odd-order distortion compensation signal $\hat{z}_H(n)$ on the high band $BW_H$ (see FIG. 2) side are each generated, using the coefficients obtained in Formula 48 as expressed in the following Formula 49 (S42).

$$\hat{z}_L(n) = \alpha_L x_L(n) \quad (49)$$
$$\hat{z}_H(n) = \alpha_H x_H(n)$$

In this manner, it is possible to update the distortion compensation coefficient after causing the amplitudes and the phases of the transmission signal $x_H(n)$ to be subtracted and the transmission signal component $x_H(n)$ on the high band $BW_H$ (see FIG. 2) side included in the odd-order distortion common feedback signal $y_{odd}(n)$ to almost completely match each other, and causing the amplitudes and the phases of the transmission signal $x_L(n)$ to be subtracted and the transmission signal component $x_L(n)$ on the high band $BW_L$ (see FIG. 2) side included in the odd-order distortion common feedback signal $y_{odd}(n)$ to almost completely match each other by performing the odd-order distortion compensation signal processing only with the first-order term as the initial value detection.

Modification 5

Figure 11:
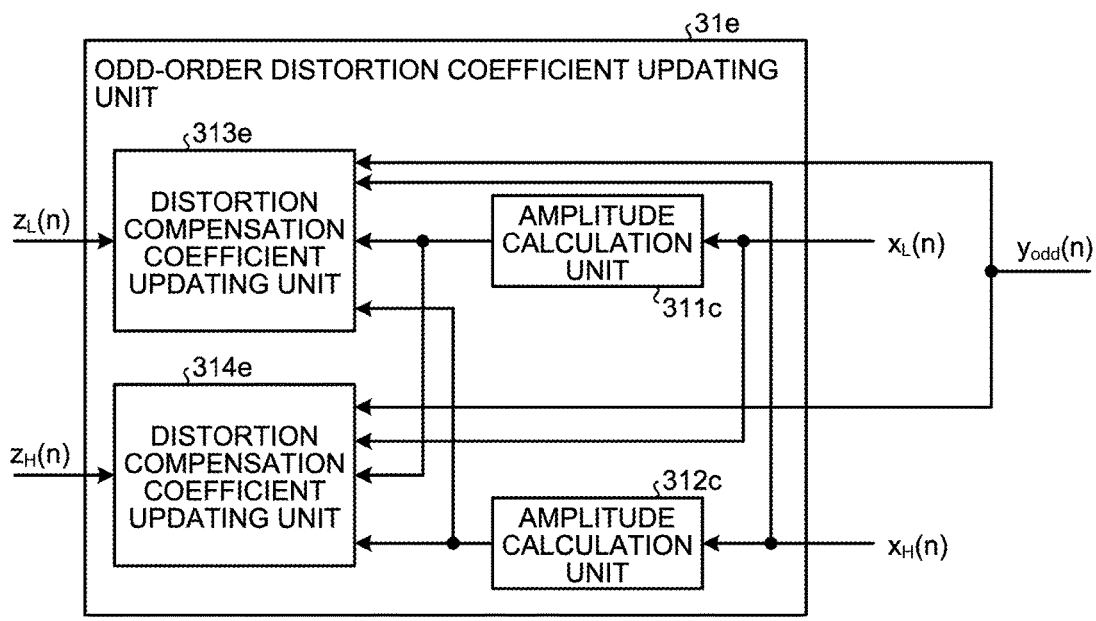
FIG. 11 is a diagram illustrating a configuration of an odd-order distortion compensation coefficient updating unit according to Modification 5.

In Modification 5, an odd-order distortion compensation coefficient updating unit 31e is configured by hybridizing the odd-order distortion compensation coefficient updating unit 31c (see FIG. 7B) of Modification 3 and the odd-order distortion compensation coefficient updating unit 31d (see FIG. 9) of Modification 4. Specifically, the odd-order distortion compensation coefficient updating unit 31e includes the amplitude calculation unit 311c, the amplitude calculation unit 312c, a distortion compensation coefficient updating unit 313e, and a distortion compensation coefficient updating unit 314e as illustrated in FIG. 11.

For example, the distortion compensation coefficient updating unit 313e and the distortion compensation coefficient updating unit 314e update the distortion compensation coefficient vectors ^A and ^B using the vectors $z_L$ and $z_H$ including the signal, after having been subjected to distortion compensation processing before being subjected to coefficient updating, and the matrices $W_L$ and $W_H$ including the common feedback signal and the odd-order terms of the respective transmission signals. The distortion compensation coefficient updating unit 313e and the distortion compensation coefficient updating unit 314e update the distortion compensation coefficient vectors ^A and ^B as expressed in the following Formula 50.

$$\hat{A} = (W_L^H W_L)^{-1} W_L^H z_L \quad (50)$$
$$\hat{B} = (W_H^H W_H)^{-1} W_H^H z_H$$

The distortion compensation coefficient vectors ^A and ^B in Formula 50 are expressed by the following Formula 51.

$$\hat{A} = [\hat{A}_L^T\ b_L^T]^T \quad (51)$$
$$\hat{A}_L = [\hat{A}_{0,0}\ ...\ \hat{A}_{P,Q}]^T$$
$$b_L = [b_{0,0}\ ...\ b_{P,Q}]^T$$
$$\hat{B} = [a_H^T\ \hat{B}_H^T]^T$$
$$a_H = [a_{0,0}\ ...\ a_{P,Q}]^T$$
$$\hat{B}_H = [\hat{B}_{0,0}\ ...\ \hat{B}_{P,Q}]^T$$

The matrices $W_L$ and $W_H$ in Formula 50 are expressed by the following Formula 52.

$$W_L = [W_{L,L}\ W_{L,H}]^T \quad (52)$$
$$W_{L,L} = [w_{L,L}(n)\ w_{L,L}(n+1)\ ...\ w_{L,L}(n+N-1)]^T$$
$$w_{L,L}(k) = \begin{bmatrix} y_{odd}(k)\ |x_L(k)|^2 y_{odd}(k)\ |x_H(k)|^2 y_{odd}(k)\ ... \\ |x_L(k)|^{2P}|x_H(k)|^{2Q} y_{odd}(k) \end{bmatrix}$$
$$W_{L,H} = [w_{L,H}(n)\ w_{L,H}(n+1)\ ...\ w_{L,H}(n+N-1)]^T$$
$$w_{L,H}(k) = \begin{bmatrix} x_H(k)\ |x_L(k)|^2 x_H(k)\ |x_H(k)|^2 x_H(k)\ ... \\ |x_L(k)|^{2P}|x_H(k)|^{2Q} x_H(k) \end{bmatrix}$$
$$W_H = [W_{H,H}\ W_{H,L}]^T$$
$$W_{H,H} = [w_{H,H}(n)\ w_{H,H}(n+1)\ ...\ w_{H,H}(n+N-1)]^T$$
$$w_{H,H}(k) = \begin{bmatrix} y_{odd}(k)\ |x_L(k)|^2 y_{odd}(k)\ |x_H(k)|^2 y_{odd}(k)\ ... \\ |x_L(k)|^{2P}|x_H(k)|^{2Q} y_{odd}(k) \end{bmatrix}$$
$$W_{H,L} = [w_{H,L}(n)\ w_{H,L}(n+1)\ ...\ w_{H,L}(n+N-1)]^T$$
$$w_{H,L}(k) = \begin{bmatrix} x_L(k)\ |x_L(k)|^2 x_L(k)\ |x_H(k)|^2 x_L(k)\ ... \\ |x_L(k)|^{2P}|x_H(k)|^{2Q} x_L(k) \end{bmatrix}$$

The vectors $z_L$ and $z_H$ in Formula 50 are expressed by the following Formula 53.

$$z_L = [z_L(n)\ z_L(n+1)\ ...\ z_L(n+N-1)]^T \quad (53)$$
$$z_L(n) = \sum_{p=0}^{P}\sum_{q=0}^{Q} A_{p,q}|x_L(n)|^{2p}|x_H(n)|^{2q}x_L(n)$$
$$z_H = [z_H(n)\ z_H(n+1)\ ...\ z_H(n+N-1)]^T$$
$$z_H(n) = \sum_{p=0}^{P}\sum_{q=0}^{Q} B_{p,q}|x_L(n)|^{2p}|x_H(n)|^{2q}x_H(n)$$

The distortion compensation coefficient updating unit 313e and the distortion compensation coefficient updating unit 314e supply the distortion compensation coefficient vectors ^A and ^B updated according to Formula 50 to the odd-order distortion compensation unit 33. The odd-order distortion compensation unit 33 uses the distortion compensation coefficient vectors ^A and ^B updated according to Formula 50 to generate the signals ^$z_L$(n) and ^$z_H$(n) after having been subjected to the distortion compensation processing according to the following Formula 54.

$$\hat{z}_L(n) = \sum_{p=0}^{P} \sum_{q=0}^{Q} \hat{A}_{p,q} |x_L(n)|^{2p} |x_H(n)|^{2q} x_L(n) \\ \hat{z}_H(n) = \sum_{p=0}^{P} \sum_{q=0}^{Q} \hat{B}_{p,q} |x_L(n)|^{2p} |x_H(n)|^{2q} x_H(n) \quad (54)$$

At this time, a half of components of the distortion compensation coefficient vector are used to generate the signal after having been subjected to the distortion compensation processing. That is, the part of ^$A_L$ in the distortion compensation coefficient vector ^A is used, and the part of ^$B_H$ in the distortion compensation coefficient vector ^B is used.

Since the distortion compensation coefficient is calculated using the transmission signals $x_L$(n) and $x_H$(n) instead of the odd-order distortion feedback signal replicas ^$y_L$(n) and ^$y_H$(n) in this manner, it is possible to update the distortion compensation coefficient while causing the distortion compensation coefficient to further follow the transmission signal $x_L$(n) and $x_H$(n). In addition, it is possible to cancel the other transmission signal from the odd-order common feedback signal substantially after causing the amplitude and phase of the transmission signal to be subtracted and the transmission signal component included in the odd-order distortion common feedback signal $y_{odd}$(n) to almost completely match each other by updating the distortion compensation coefficient based on the power series including the terms and coefficients (a part $b_L$ in distortion compensation coefficient vector ^A and a part ^$a_H$ in the distortion compensation coefficient vector ^B) which are not directly used for the distortion compensation processing.

According to one aspect of a distortion compensation apparatus and a distortion compensation method disclosed in the present application, it is possible to easily reduce the scale of a circuit of the distortion compensation apparatus.

All examples and conditional language recited herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. A distortion compensation apparatus comprising:
a feedback unit that generates a feedback signal containing a first frequency component in which a plurality of odd-order distortions are superimposed and a second frequency component in which a plurality of even-order distortions are superimposed according to output of a power amplifier which amplifies a transmission signal; and
a signal processor that separates each of the first frequency component and the second frequency component from the generated feedback signal and performs signal processing.

2. The distortion compensation apparatus according to claim 1, wherein
the feedback unit comprises a first frequency conversion unit that generates the feedback signal by down-converting a signal according to the output of the power amplifier from a transmission frequency to an intermediate frequency and folding the signal at the intermediate frequency.

3. The distortion compensation apparatus according to claim 2, wherein
the feedback unit further comprises:
a second frequency conversion unit that down-converts the feedback signal generated by the first frequency conversion unit from the intermediate frequency to a baseband frequency; and
an AD conversion unit that converts the feedback signal, which is down-converted to the baseband frequency by the second frequency conversion unit, from an analog format to a digital format.

4. The distortion compensation apparatus according to claim 1, wherein
the signal processor comprises:
a first generation unit that extracts the first frequency component from the feedback signal generated by the feedback unit and generate a first signal and a second signal according to the first frequency component; and
a second generation unit that extracts the second frequency component from the feedback signal generated by the feedback unit and generate a third signal and a fourth signal according to the second frequency component.

5. The distortion compensation apparatus according to claim 4, wherein
the first generation unit comprises a third frequency conversion unit that extracts the first frequency component from the feedback signal, and
the second generation unit comprises a fourth frequency conversion unit that extracts the second frequency component from the feedback signal.

6. The distortion compensation apparatus according to claim 4, wherein
the first generation unit further comprises:
a third frequency conversion unit that shifts a center frequency of the feedback signal to a frequency corresponding to the first frequency component; and
a first low-pass filter that extracts the first frequency component from the feedback signal having the center frequency shifted by the third frequency conversion unit, and
the second generation unit further comprises:
a fourth frequency conversion unit that shifts the center frequency of the feedback signal to a frequency corresponding to the second frequency component; and
a second low-pass filter that extracts the second frequency component from the feedback signal having the center frequency shifted by the fourth frequency conversion unit.

7. The distortion compensation apparatus according to claim 4, wherein
the first signal corresponds to a first frequency band,
the second signal corresponds to a second frequency band, the transmission signal includes a fifth signal corresponding to the first frequency band and a sixth signal corresponding to the second frequency band, and the first generation unit further comprises:
- a third frequency conversion unit that extracts the first frequency component from the feedback signal,
- a first subtraction unit that generates the first signal by subtracting the sixth signal from a signal containing the first frequency component extracted by the third frequency conversion unit; and
- a second subtraction unit that generates the second signal by subtracting the fifth signal from the signal containing the first frequency component extracted by the third frequency conversion unit.

8. The distortion compensation apparatus according to claim 7, wherein
the first generation unit outputs the signal containing the first frequency component at first sampling and outputs the first signal and the second signal at second and subsequent sampling, the distortion compensation apparatus further comprising:
- an odd-order updating unit that obtains an initial value of odd-order distortion compensation coefficients using the sixth signal, the fifth signal, and the signal containing the first frequency component at the first sampling, and updates the odd-order distortion compensation coefficients using the sixth signal, the fifth signal, the first signal, and the second signal at the second and subsequent sampling;
- an even-order updating unit that updates even-order distortion compensation coefficients using the third signal and the fourth signal;
- an odd-order distortion compensation unit that compensates for odd-order distortions in the transmission signal using the obtained initial value of the odd-order distortion compensation coefficients at the first sampling and compensates for odd-order distortions in the transmission signal using the updated odd-order distortion compensation coefficients at the second and subsequent sampling; and
- an even-order distortion compensation unit that compensates for even-order distortions in the transmission signal using the even-order distortion compensation coefficients.

9. The distortion compensation apparatus according to claim 7, further comprising:
- an odd-order updating unit that updates odd-order distortion compensation coefficients using the sixth signal, the fifth signal, and the signal containing the first frequency component;
- an even-order updating unit that updates even-order distortion compensation coefficients using the third signal and the fourth signal;
- an odd-order distortion compensation unit that compensates for odd-order distortions in the transmission signal using the odd-order distortion compensation coefficients; and
- an even-order distortion compensation unit that compensates for even-order distortions in the transmission signal using the even-order distortion compensation coefficients.

10. A distortion compensation method comprising:
generating a feedback signal containing a first frequency component in which a plurality of odd-order distortions are superimposed and a second frequency component in which a plurality of even-order distortions are superimposed according to output of a power amplifier which amplifies a transmission signal; and separating each of the first frequency component and the second frequency component from the generated feedback signal and performing signal processing.

* * * * *